(12) United States Patent
Schmidt et al.

(10) Patent No.: US 12,119,412 B2
(45) Date of Patent: Oct. 15, 2024

(54) SEMICONDUCTOR VERTICAL SCHOTTKY DIODE AND METHOD OF MANUFACTURING THEREOF

(71) Applicant: LFOUNDRY S.R.L., Avezzano (IT)

(72) Inventors: Carsten Schmidt, Avezzano (IT); Gerhard Spitzlsperger, Avezzano (IT)

(73) Assignee: LFOUNDRY S.R.L. (IT)

( * ) Notice: Subject to any disclaimer, the term of this patent is extended or adjusted under 35 U.S.C. 154(b) by 667 days.

(21) Appl. No.: 17/276,894

(22) PCT Filed: Sep. 20, 2019

(86) PCT No.: PCT/EP2019/075320
§ 371 (c)(1),
(2) Date: Mar. 17, 2021

(87) PCT Pub. No.: WO2020/058473
PCT Pub. Date: Mar. 26, 2020

(65) Prior Publication Data
US 2021/0351304 A1    Nov. 11, 2021

(30) Foreign Application Priority Data
Sep. 21, 2018 (IT) .......................... 102018000008823

(51) Int. Cl.
*H01L 29/872* (2006.01)
*H01L 29/06* (2006.01)

(52) U.S. Cl.
CPC ........ *H01L 29/872* (2013.01); *H01L 29/0619* (2013.01)

(58) Field of Classification Search
CPC . H01L 29/872; H01L 29/0619; H01L 29/417; H01L 29/66143; H01L 27/0629
See application file for complete search history.

(56) References Cited

U.S. PATENT DOCUMENTS 6,825,073 B1 * 11/2004 Wu ................... H01L 21/28537
438/575
7,002,187 B1    2/2006 Husher
(Continued)

FOREIGN PATENT DOCUMENTS

CN       102694033 A    9/2012
EP        2913847 A1    9/2015
(Continued)

OTHER PUBLICATIONS

Tojo Junichiro, JP-2007317839-A, English Translation, pub. date Dec. 6, 2007, pp. 1-25 (Year: 2007).*
(Continued)

*Primary Examiner* — Shaun M Campbell
(74) *Attorney, Agent, or Firm* — The Belles Group, P.C.

(57) ABSTRACT

A semiconductor vertical Schottky diode device, having: a substrate of semiconductor material, with a front surface and a back surface; a lightly doped region formed in a surface portion of the substrate facing the front surface, having a first conductivity type; a first electrode formed on the lightly doped region on the front surface of the substrate, to establish a Schottky contact; a highly doped region at the back surface of the substrate, in contact with the lightly doped region and having the first conductivity type; and a second electrode electrically in contact with the highly doped region, on the back surface of the substrate, to establish an Ohmic contact.

8 Claims, 18 Drawing Sheets

(56) References Cited

U.S. PATENT DOCUMENTS

| | | | |
|---|---|---|---|
| 10,157,980 B1* | 12/2018 | Lo .................... | H01L 29/0649 |
| 2006/0071271 A1* | 4/2006 | Omura ............. | H01L 29/41766 |
| | | | 438/296 |
| 2008/0296722 A1 | 12/2008 | Girdhar et al. | |
| 2012/0068297 A1 | 3/2012 | Tsai | |
| 2016/0379936 A1* | 12/2016 | Spitzlsperger ...... | H01L 29/0649 |
| | | | 257/139 |
| 2020/0006322 A1* | 1/2020 | Then ................. | H01L 27/0255 |

FOREIGN PATENT DOCUMENTS

| | | |
|---|---|---|
| JP | 2007317839 A | 12/2007 |
| TW | 201601327 A | 1/2016 |

OTHER PUBLICATIONS

PCT International Search Report and Written Opinion issued by the International Bureau for PCT Application No. PCT/EP2019/075320, dated Jun. 12, 2019, pp. 1-11.

\* cited by examiner

SEMICONDUCTOR VERTICAL SCHOTTKY DIODE AND METHOD OF MANUFACTURING THEREOF

CROSS-REFERENCE TO RELATED PATENT APPLICATIONS

The present application is a U.S. national stage application under 35 U.S.C. § 371 of PCT Application No. PCT/EP2019/075320, filed Sep. 20, 2019, which claims priority from Italian Patent Application No. 102018000008823, filed on Sep. 21, 2018, the entire disclosure of which is incorporated herein by reference.

The present solution relates to a semiconductor vertical Schottky diode, and to a corresponding manufacturing process; in particular, the following disclosure will make reference to a semiconductor vertical Schottky diode fabricated in Complementary Metal-Oxide-Semiconductor (CMOS) technology.

As it is known, a Schottky diode is mainly used as a switching element or as a rectification element and uses a metal-semiconductor junction having superior high-speed switching characteristics as compared with a general PN junction diode. This is because minority carrier injection does not occur when a forward voltage is applied to the Schottky diode, differently from a p-n junction diode; in a Schottky diode, a current flows by majority carriers only.

Semiconductor Schottky diodes are extensively found in the art.

For example, FIG. 1 shows a typical integrated high voltage Schottky diode with a lateral drift region, denoted in general with 100 (a diode of this type is disclosed e.g. in US 2012/068297 A1). The Schottky diode 100 is formed in a substrate 101 of semiconductor material, in particular silicon; substrate 101 has a frontside surface 101a and a back surface 101b, with a main extension in a horizontal plane xy and separated along a vertical direction z, orthogonal to the same horizontal plane xy. A lightly doped well 102 of a first conductivity type, for example n-type, is formed in a surface portion of the substrate 101, abutting (or facing) the frontside surface 101a; the substrate 101 has a doping of a second conductivity type, in the example a p-type doping. Shallow trench isolation regions 104, of a dielectric material, formed in the substrate 101, at the frontside surface 101a thereof, provide a spatial separation between anode, cathode and body electrodes of the Schottky diode 100.

In particular, a first electrode, e.g. an anode electrode, 111a of the Schottky diode 100 (in the case of semiconductor n-type conductivity), constituted by a metal silicide contact formed on the lightly doped well 102, establishes a Schottky contact with the same lightly doped well 102. The silicide formation is blocked laterally by means of a silicide blocking layer 110, formed on the frontside surface 101a of the substrate 101; an opening 112 is defined in the silicide blocking layer 110, through which the metal silicide and the corresponding Schottky contact area are defined.

The edge of the Schottky contact area is usually prone to increased leakage; therefore, a guard ring 108, being a doped region of the second conductivity type (in the example, p-type), is formed in the lightly doped well 102, at the perimeter region of the Schottky contact area. A second electrode, e.g. a cathode electrode, 111c of the Schottky diode 100 is established by forming an Ohmic metal contact on the lightly doped well 102 (which, in this case, has n-type conductivity). This is accomplished by forming a metal silicide contact on a highly doped region 109 formed in the lightly doped well 102, at the frontside surface 101a of the substrate 101. The highly doped region 109 has the first conductivity type (n-type) and is formed e.g. by ion implantation. In FIG. 1, two cathode electrodes 111c are shown, laterally delimited by respective shallow trench isolation regions 104.

It is to be noted, in any case, that in a Schottky diode, being a metal/semiconductor junction diode, the metal side is called the anode and the semiconductor side is called the cathode, when the semiconductor is n-type. If, in the contrary, the semiconductor is p-type (i.e. the lightly doped well 102 has p-type conductivity), the metal side forms the cathode and the semiconductor side forms the anode of the Schottky diode.

Moreover, a substrate (or body) electrode 111b is provided by forming a further metal silicide contact on a further highly doped region 107, having the second conductivity type (p-type) and formed in the substrate 101, at the frontside surface 101a, outside of the lightly doped well 102. The highly doped regions 107, 109 are separated by a shallow trench isolation region 104.

In many applications, it is required that the Schottky diode 100 is able to sustain high voltages in reverse bias, with a breakdown voltage for example of about 30 V. In order to achieve such a high breakdown voltage, anode and cathode electrodes 111a, 111c need to be spatially separated in the lightly doped well 102; the length of separation is denoted by Ld in FIG. 1, where La denotes the length of the anode electrode 111a, Lc denotes the length of the cathode electrode 111c, and L denotes the total length in the lateral direction (along the x axis of the horizontal plane xy, in FIG. 1) of the Schottky diode 100, including also the substrate electrode 111b.

An important characteristic for an integrated Schottky diode is the area consumption needed to provide a specific forward current. For a given Schottky diode design, the forward current depends on the size of the Schottky contact. The area efficiency of the Schottky diode can be defined as the ratio of the Schottky contact area to the total area of the Schottky diode. As is obvious from FIG. 1, the area efficiency of the Schottky diode 100 is not optimal; this being due to the lateral configuration of the diode and to the fact that optimum settings exist for lengths La and Lc given by the design. Increasing the length La beyond its optimum value will result in an unnecessary high series resistance of the Schottky diode. To provide a large forward current, the Schottky diode thus needs to have a large width (along the y axis of the horizontal plane xy) accordingly, or a multi-stripe structure has to be used, in any case entailing a high area occupation.

The Schottky diode 100 has further disadvantages. The guard ring 108, the lightly doped well 102 and the substrate 101 form a parasitic bipolar transistor. Depending on the current gain of this parasitic bipolar transistor, the Schottky characteristics of the Schottky diode 100 may significantly deviate from desired characteristics. The guard ring 108 introduces also a parasitic capacitance and gives rise to minority carrier injection deteriorating the switching performance. Since there is an optimum value for the length La of the Schottky contact, the parasitic capacitance of the Schottky diode 100 cannot be easily reduced. Moreover, the Schottky diode 100 shown in FIG. 1 is not isolated, so that currents may flow towards the substrate 101.

FIG. 2 show another typical Schottky diode configuration, denoted with 200, in this case having a vertical drift region (a diode of this type is disclosed e.g. in US 2008/296722 A1).

The Schottky diode 200 is generally similar to the Schottky diode 100 of FIG. 1 (so that corresponding elements are denoted with the same references and are not discussed again), but includes a highly doped buried layer 202, having the first conductivity type (n-type), formed directly below and in contact with the lightly doped well 102.

The highly doped region 109 of the cathode electrode 111c of the Schottky diode 200 is in this case connected to the buried layer 202 via a highly doped connecting region 203, having the first conductivity type (n-type), extending along the vertical direction z. The highly doped connecting region 203 may be formed by a sequence of high dose implants of varied implant energy. The highly doped connecting region 203 is commonly called a "sinker". The lightly doped well 102 is in this case laterally delimited by two highly doped connecting regions 203, corresponding to the two cathode electrodes 111c.

In the Schottky diode 200, the length La of the Schottky contact area can be made quite large due to the vertical configuration.

In the forward bias, the current flows vertically through the lightly doped well 102 reaching the highly doped buried region 202. The highly doped buried region 202 collects the current, which then flows laterally through the same highly doped buried layer 202 to reach the highly doped connecting regions 203, from the which the cathode contacts 111c are reached. In reverse bias, the applied voltage drops vertically across the depleted region of the lightly doped well 102.

The vertical-drift configuration of the Schottky diode 200 allows a higher area efficiency compared to that of the Schottky diode 100 of FIG. 1. However, the buried layer 202 and the highly doped connecting regions 203 increase the series resistance of the Schottky diode 200. The larger the Schottky contact length La, the larger the series resistance associated with the highly doped buried layer 202. As a consequence, there is again an optimum value for the length La, limiting the area efficiency of the Schottky diode 200.

A further known solutions for a semiconductor Schottky diode is disclosed e.g. in U.S. Pat. No. 7,002,187 B1, which discloses a Schottky diode formed on an epitaxial (epi) layer. An N+ buried channel is formed in a substrate on which the epi layer is grown. The N+ buried channel is accessed by an oxidized vertical metal slot, which is connected to a metal electrode, arranged on the epi layer, that forms the cathode of the Schottky diode. A further metal electrode, also arranged on the epi layer, forms the anode of the Schottky diode. P+ guard rings are formed laterally in the epi layer, to solve the problem of high edge leakage due to high junction curvature.

Also in this known solution, the N+ buried layer introduces a parasitic series resistance, whose value increases with increasing lateral dimensions of the Schottky contact area.

The aim of the present invention is to provide an improved solution for a semiconductor Schottky diode, allowing to overcome the limitations of known solutions, for example in terms of area efficiency, manufacturing costs and electrical performances.

According to the present solution, a semiconductor CMOS-based vertical Schottky diode device and a corresponding manufacturing process are consequently provided, as defined in the appended claims.

For a better understanding of the present invention, preferred embodiments thereof are now described purely by way of non-limiting example and with reference to the attached drawings, wherein.

As will be discussed in details in the following, an aspect of the present solution envisages forming the Ohmic metal (cathode) contact of the Schottky diode on the thinned backside of a substrate, opposite to the Schottky (anode) contact established on the frontside of the same substrate. Schottky contact and Ohmic contact have approximately the same size in the horizontal plane and are separated in the vertical direction by the lightly doped substrate in-between. The Schottky contact on the frontside is formed by standard CMOS processes. The electrical contact on the thinned backside is made available to the wirings (conductive interconnections) on the front side by a Through Silicon Via (TSV) structure, which laterally encloses the Schottky diode, thus also providing full dielectric isolation thereof.

Figure 1:
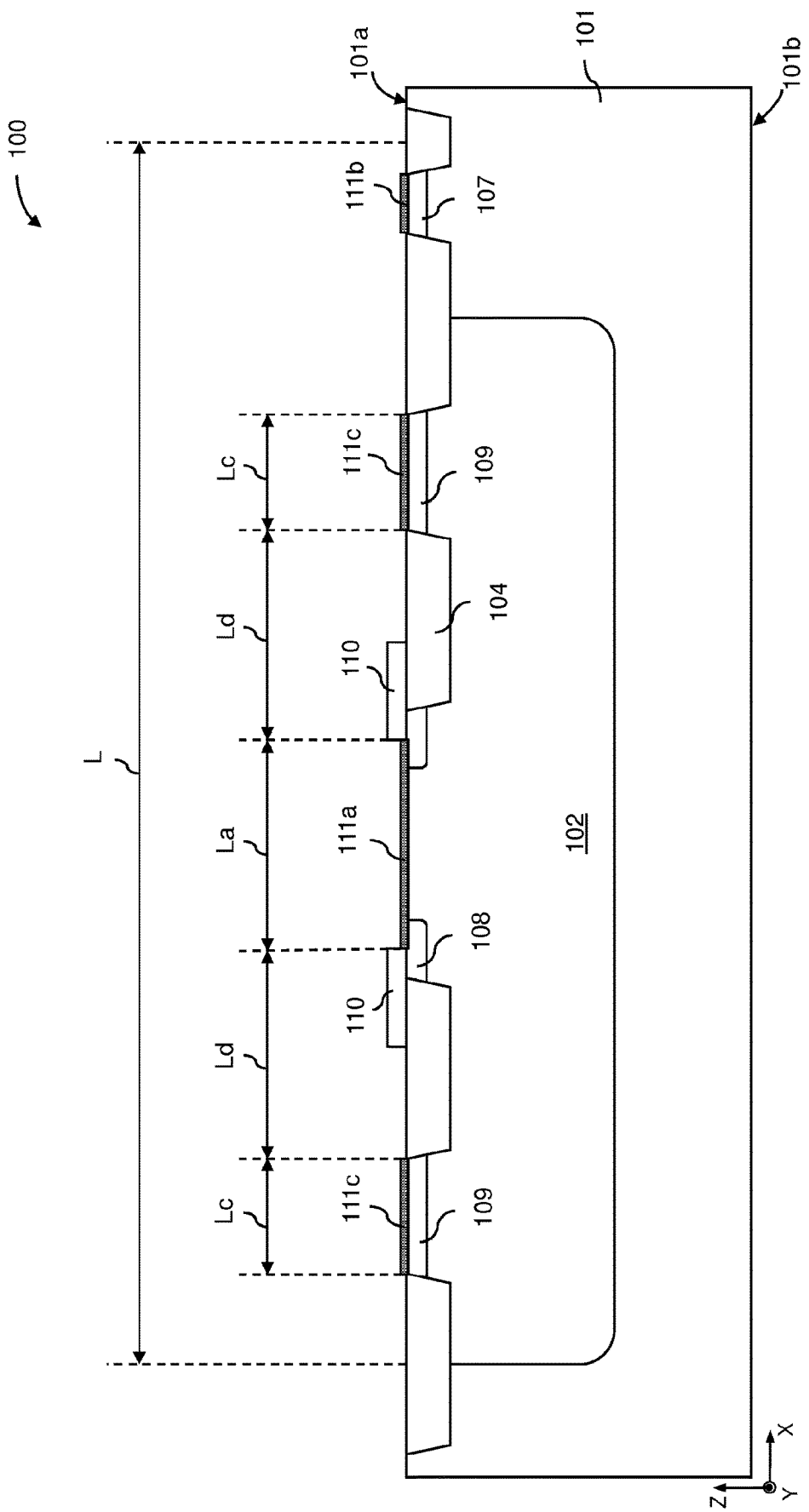
FIG. 1 is a cross-section of a known semiconductor Schottky diode.
Figure 2:
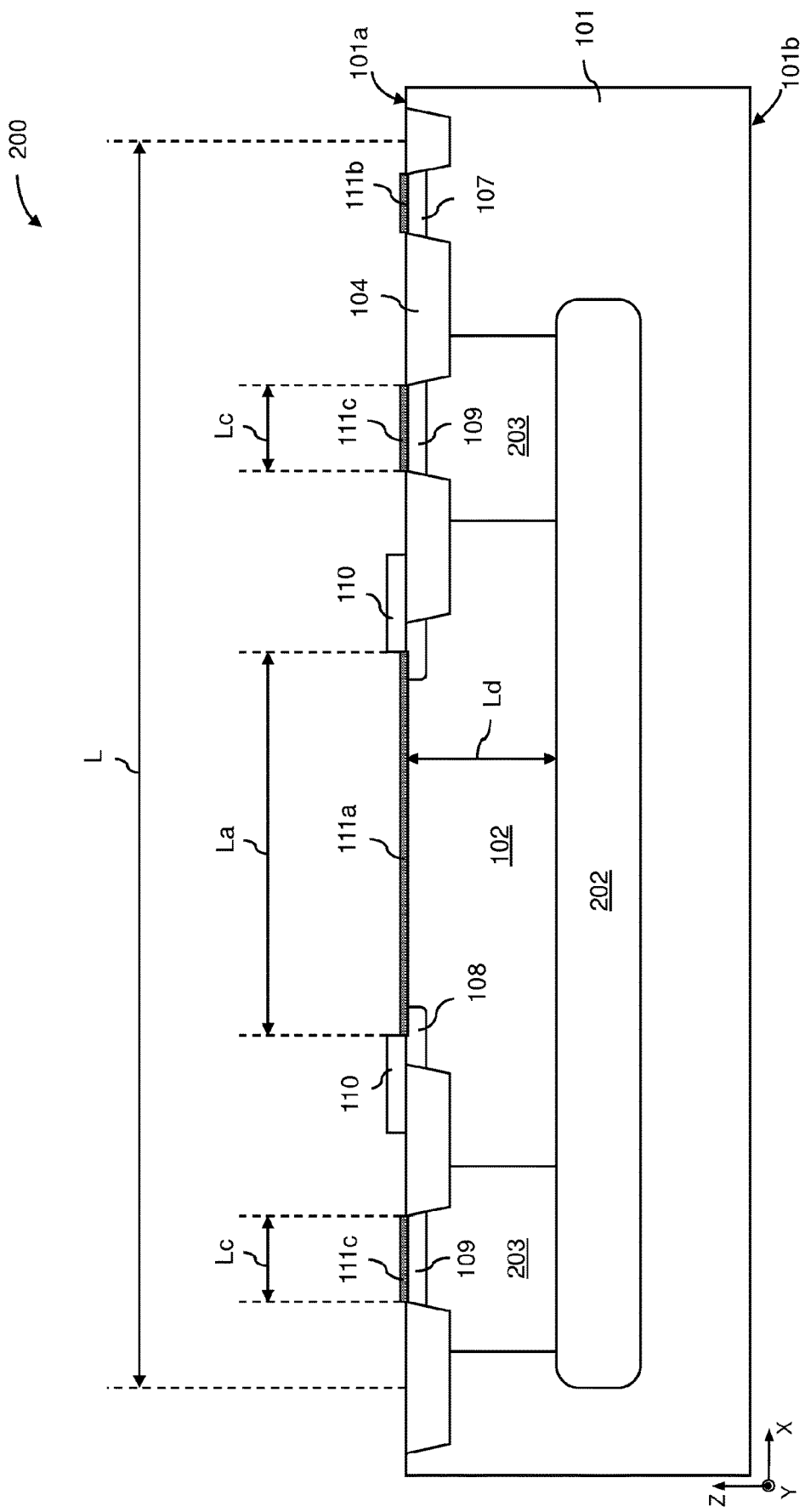
FIG. 2 is a cross-section of another known semiconductor Schottky diode.
Figure 3:
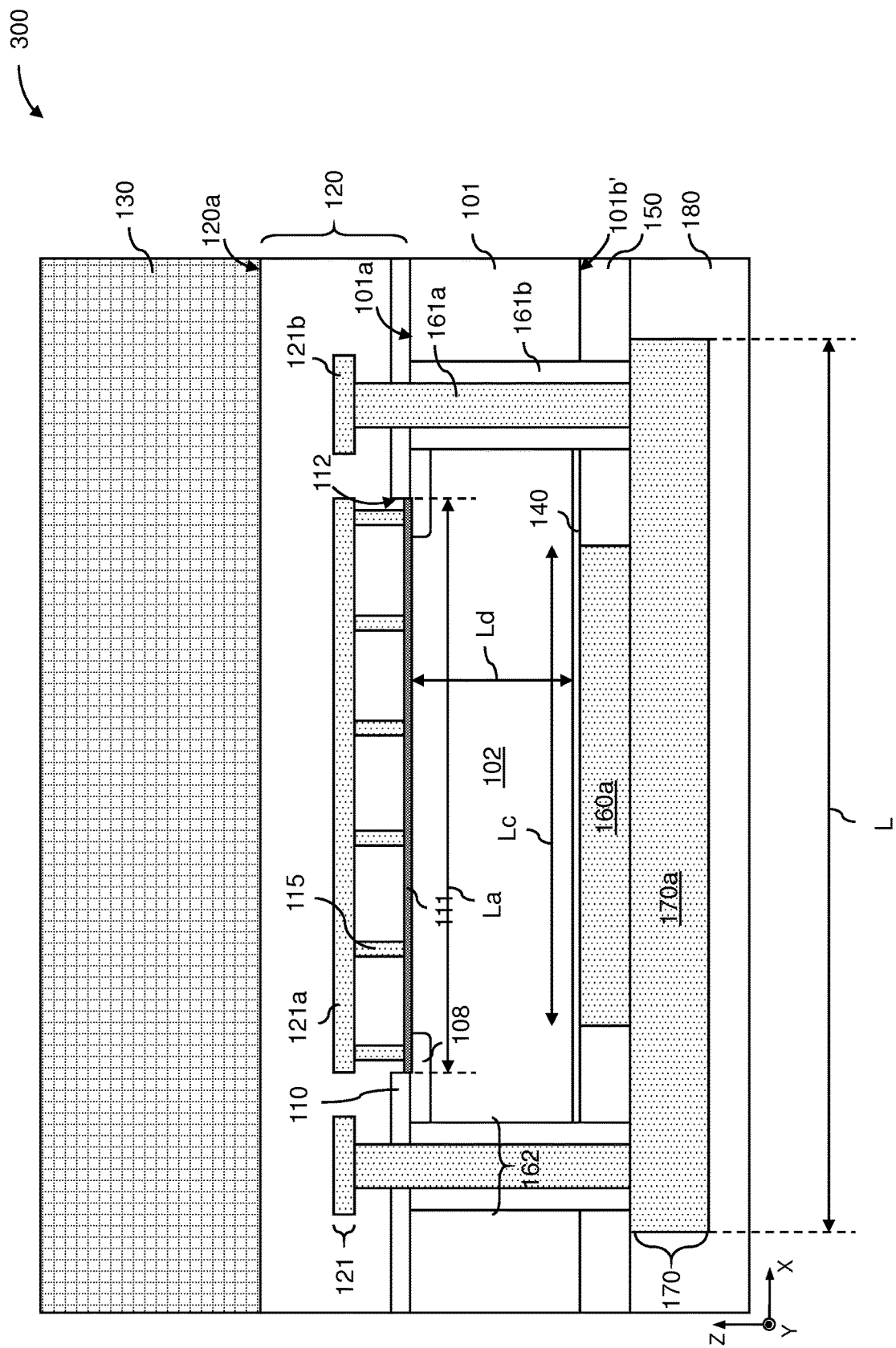
FIG. 3 is a cross-section of a semiconductor vertical Schottky diode, according to a first embodiment of the present solution.

FIG. 3 shows an integrated high-voltage vertical Schottky diode 300 according to a first embodiment of the present solution, manufactured with standard CMOS technology.

The Schottky diode 300 is formed on a semiconductor substrate, again denoted with 101 (in FIG. 3 and in the following Figures, corresponding elements are again denoted with the same references), having a frontside surface 101a. The substrate 101 is preferably a silicon wafer, or an epitaxial silicon layer. A lightly doped region (so called well) 102 is formed in a surface portion of the substrate 101, facing the frontside surface 101a and having a first conductivity type (for example n-type); the substrate 101 has a second conductivity type, in the example p-type (n-type doping is, however, also possible, as well as the use of other semiconductor materials).

A metal region 111 is formed on the lightly doped well 102, on the frontside surface 101a of the substrate 101, to define a Schottky contact with the lightly doped well 102.

In the preferred embodiment, the metal region 111 is a metal silicide layer, preferably a cobalt silicide layer; as it is known, in many CMOS processes cobalt silicide is used to reduce source and drain contact resistances, so that this material is easily available for the formation of the Schottky diode 300 (use of other metals or metal silicides is in any case as well possible).

In many CMOS processes, the silicidation of silicon or polysilicon can be blocked where it is unwanted. This is accomplished by deposition of silicide blocking layer 110 on the frontside surface 101a, through which an opening 112 is formed by a photo-masking etching step, to define the surface area of the lightly doped well 102 where silicidation takes place. The silicide blocking layer 110 is usually a silicon oxide layer or a stacked-layer consisting of a silicon oxide and a silicon nitride layer.

At the edge of the metal region 111 a guard ring 108 is formed in the surface portion of the substrate 101. The guard ring 108 is a doped region having the opposite conductivity type of the lightly doped well 102, in the example the second conductivity type (p-type). The guard ring 108 may be formed by implantation and subsequent annealing steps. In the embodiment of FIG. 3, the guard ring 108 has an overlap with respect to the metal region 111.

It is known that at the edge of a cobalt silicided region often a high number of surface states and traps exists, which can give rise to an increased leakage level; moreover, due to the curvature of the cobalt silicide in the perimeter region, high electric fields may occur at this position, when a reverse bias is applied. The guard ring 108 effectively reduces the leakage of the Schottky diode 300 originating from the edge of the cobalt silicided area. Since the guard ring 108 has the doping of the second conductivity type, a p-n junction is formed with the lightly doped well 102.

As in standard CMOS processes, a CMOS layer stack is arranged on the frontside surface 101a of the substrate 101, including a number of dielectric and interconnected conductive layers. For sake of simplicity, FIG. 3 shows an intermetal dielectric layer 120 and a single interconnection metal layer 121 (the first interconnection metal layer), arranged in the intermetal dielectric layer 120 (however, further metal layers, separated by the dielectric layer, are generally envisaged, as will be clear for a skilled person). The first interconnection metal layer 121 is made of a conductive material like tungsten, aluminum, copper or the like; the intermetal dielectric layer 120 is made of silicon oxide or other dielectric materials, preferably having low dielectric constant.

Electrical contacts 115, formed in the intermetal dielectric layer 120 and extending in the vertical direction z, establish a connection between the metal region 111 and a first interconnection pad 121a formed in the first interconnection metal layer 121. As shown in FIG. 3, contacts 115 may also be formed where the guard ring 8 overlaps the cobalt silicide area.

In particular, the metal region 111 constitutes the first electrode, in the example the anode electrode, of the Schottky diode 300, and the contacts 115 and the first interconnection pad 121a allow to access this anode electrode from the frontside of the Schottky diode 300, e.g. by an integrated circuit formed in the same substrate 101 (here not shown), via suitable electrical connection paths.

As previously discussed, in FIG. 3 only one interconnection layer (the first interconnection metal layer 121) is shown, however, several interconnection metal layers and corresponding vias are possible and common.

According to an aspect of the present solution, contrary to standard CMOS solutions, no bonding or bumping pads are formed at the last interconnection metal level; instead, the top surface 120a of the intermetal dielectric layer 120 is bonded to a carrier wafer 130. The carrier wafer 130 may be a further silicon wafer or a wafer made of a different type of material that is compatible with standard CMOS processing. In particular, a permanent bond is formed between the intermetal dielectric layer 120 and the carrier wafer 130 (in any known manner, here not discussed in detail).

With the help of the carrier wafer 130, as will be also discussed in more details in the following, the substrate 101 is thinned from the backside (i.e. starting from a back side, opposite to the frontside surface 101a), such that the well 102 is exposed at a thinned backside surface, denoted with 101b' (in other words, the thickness of the well 102 corresponds to that of the thinned substrate 101).

A shallow and highly doped region 140 is formed at this backside surface 101b', within the area of the lightly doped well 102. The highly doped region 140 has the first type of conductivity, in the example n-type.

A dielectric layer 150, e.g. of silicon oxide, is arranged on the backside surface 101b', having a backside contact opening within the area of the highly doped region 140. The backside contact opening is filled with a conductive region, e.g. of tungsten, aluminum or copper, which forms the second electrode, in the example the cathode electrode 160a, of the Schottky diode 300, defining an Ohmic contact with the highly doped region 140.

To make the cathode electrode 160a of the Schottky diode 300 available to the frontside 101a of the substrate 101 and to the electrical interconnections formed thereon (e.g. towards the integrated circuit formed in the same substrate 101), a through silicon via (TSV) structure 162 is formed.

The through silicon via structure 162 extends from a bottom surface of the dielectric layer 150, through the whole thickness of the substrate 101, to a second interconnection pad 121b, formed in the same first interconnection metal layer 121 as the first interconnection pad 121a.

The through silicon via structure 162 includes a conductive filling 161a, of a conductive material like tungsten, aluminum or copper (which may be the same material of the cathode electrode 160a, or a different material), and by a dielectric liner 161b, e.g. of silicon oxide, surrounding the conductive filling 161a and electrically isolating the conductive via from the substrate 101. An electrical contact between the conductive filling 161a of the through silicon via structure 162 and the second interconnection pad 121b is thus established.

Moreover, a first interconnection region 170a, formed in a first interconnection layer 170, arranged above the backside surface 101b' (in particular, on the dielectric layer 150) establishes an electrical connection between the cathode electrode 160a and the conductive filling 161a of the through silicon via structure 162. In this way, the cathode electrode 160a of the Schottky diode 300, formed on the backside surface 101b', is made available to the wirings formed on the frontside surface 101a of the substrate 101.

In FIG. 3 only one interconnection layer on the backside is shown, where the first interconnection region 170a is formed. In general, however, more interconnection layers with corresponding vias are possible, or even required, formed in a respective intermetal dielectric layer 180, which could be made of silicon oxide or of a different dielectric material.

In the embodiment shown in FIG. 3, the Schottky diode 300 is laterally enclosed by the through silicon via structure 162 (the lightly doped well 102 laterally extends to, and is surrounded by, the same through silicon via structure 162), such that the entire substrate region enclosed by the through silicon via structure 162 is electrically insulated from the external region of the same substrate 101. The guard ring 108 extends laterally from the metal region 111, up to the through silicon via structure 162. Also, the highly doped region 140 extends laterally up to the through silicon via structure 142, such that the highly doped region 140 is arranged on the entire backside surface 101b' inside of the enclosure defined by the through silicon via 162.

In the embodiment shown in FIG. 3, therefore, the through silicon via structure 162 does not only operate to bring the cathode contact of the Schottky diode 300 to the frontside surface 101a of the substrate 101, but also to provide a dielectric isolation for the Schottky diode (e.g. from the further integrated circuit formed in the same substrate 101).

Since the through silicon via structure 162 encloses the Schottky diode 300, also the second interconnection pad 121b encloses the first interconnection pad 121a; at least a second interconnection level (not shown in FIG. 3) may therefore be present to make the anode and cathode of the Schottky diode 300 available to the integrated circuit.

During operation, if a positive voltage is applied to the anode electrode 111 with respect to the cathode electrode 160*a*, a current flows between the same anode and cathode electrodes 111, 160*a* through the lightly doped well 102. The current flow is essentially vertical. The amount of forward current depends also on the series resistance of the Schottky diode 300. The series resistance of the Schottky diode 300 is given by the series resistance of the lightly doped well 102, the series resistance of the Ohmic contact on the backside and the series resistances of all metal interconnections involved. If a negative voltage is applied to the anode electrode 111 with respect to the cathode electrode 160*a*, only a leakage current flows, provided that the applied voltage is lower than the breakdown voltage of the Schottky diode 300. In such reverse bias condition, the lightly doped well 102 becomes partially or fully depleted and the applied electrostatic potential drops across the depleted region. Since anode and cathode electrodes 111, 160*a* are placed on opposite sides of the thinned substrate 101, the electrostatic equipotential distribution is nearly planar and parallel to the silicon surface. The breakdown voltage of the Schottky diode 300 depends on the doping concentration and thickness of the lightly doped well 102, which is equal to the thickness of the substrate 101 after its thinning.

It is noted that, in FIG. 3, La denotes the length of the anode electrode 111, Lc the length of the cathode electrode 160*a* and Ld the length of the vertical drift region.

Figure 4:
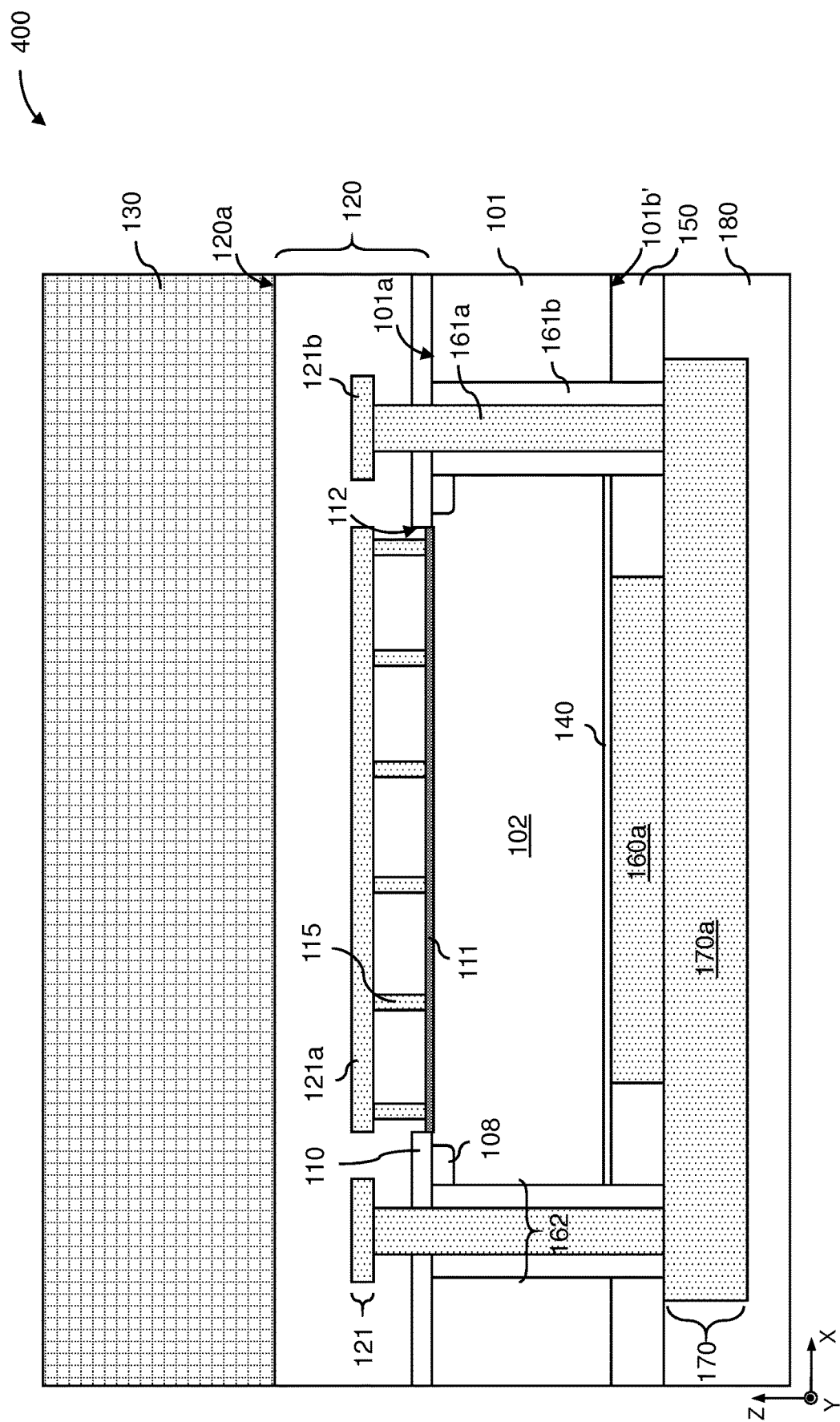
FIGS. 4-7 are cross-sections of further embodiments of a semiconductor vertical Schottky diode according to the present solution.

FIG. 4 shows an alternative embodiment of the present solution.

The Schottky diode, here denoted with 400, differs from the Schottky diode 300 of FIG. 3 only in that the guard ring 108 has no overlap with the metal region 111 (i.e. with the anode electrode). The guard ring 108 is arranged below the silicide blocking layer 110, being floating, without having an electrical connection to the anode of the Schottky diode 300. In this embodiment, the guard ring 108 still helps to reduce the electrical field at the edge of the cobalt silicided area in the reverse bias condition, provided that the spacing between the guard ring 108 and the metal region 111 is not too large. The floating guard ring 108 of the Schottky diode 400, however, does not provide a means to reduce a leakage current caused by a higher number of surface states or traps at the edge of the cobalt silicide layer. The advantage of the floating guard ring 108 is that no parallel p-n junction diode is formed in the perimeter region of the Schottky diode 400, as instead is the case for the embodiment of FIG. 3. The Schottky diode characteristics are thus not impaired by the existence of a parasitic p-n junction diode. The Schottky diode 400 has a lower minority carrier injection and a lower parasitic capacitance compared to the Schottky diode 300.

Figure 5:
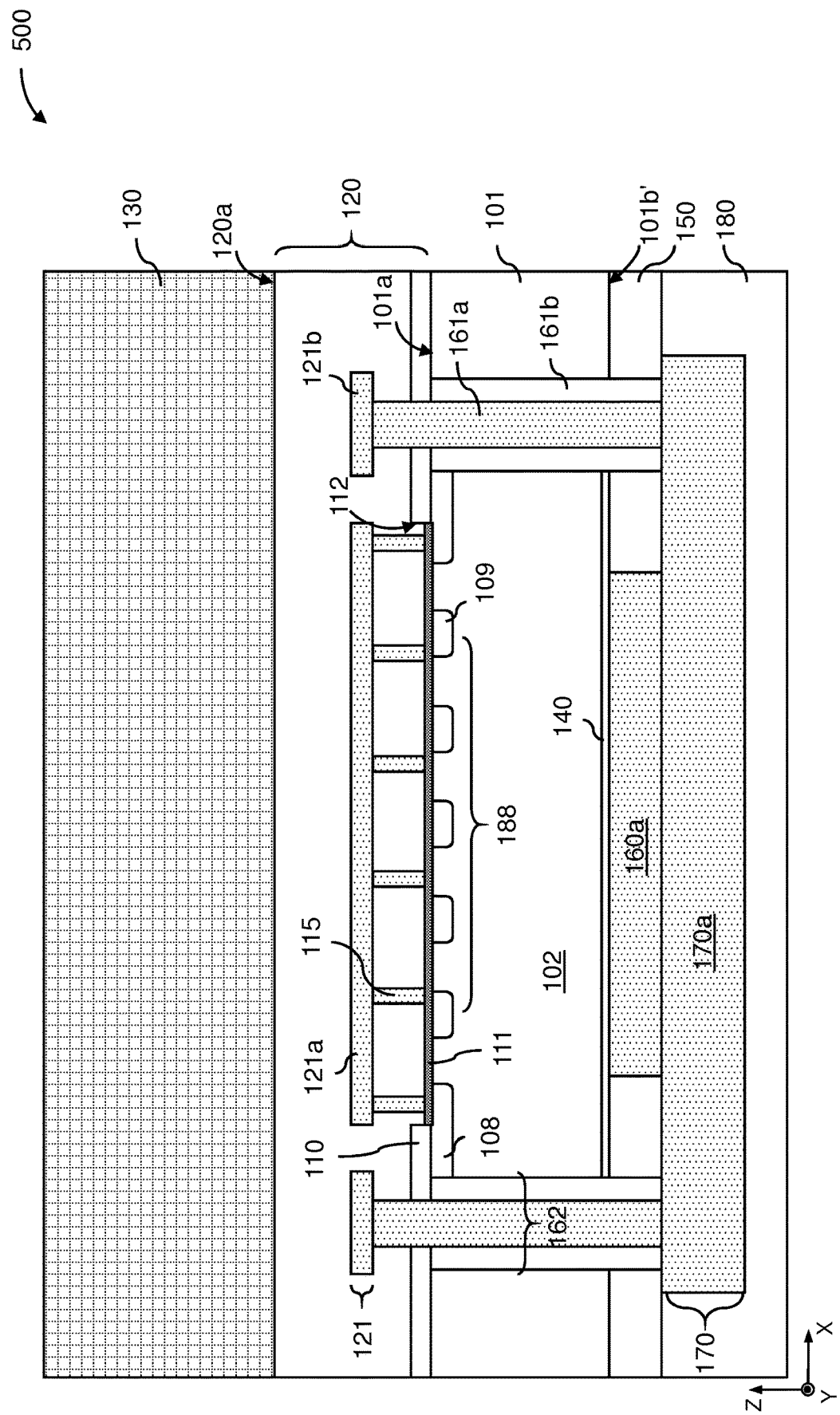

FIG. 5 shows yet another embodiment of the present solution. The Schottky diode, here denoted with 500, differs from the embodiment shown in FIG. 3 only in that a grid 188 of doped regions 109 of the second conductivity type (p-type) are formed in the lightly doped well 102 at the frontside surface 101*a* of the substrate 101. The grid 188 of doped regions 109 may be formed together with the guard ring 108 (e.g. with a same implantation step). The doped regions 109 have identical width and are equidistant in the horizontal plane xy. Different grid layout could be considered: for instance, the doped regions 109 could form concentric rings around the center of the cobalt silicide area, in the case where the same cobalt silicide area has a circular shape.

If a negative voltage is applied to the anode electrode 111 with respect to the cathode electrode 160*a*, the doped regions 109 of the grid 188 assist in the depletion of the lightly doped well 102. As a consequence, the reverse leakage current is reduced.

The grid 188 of doped regions 109 constitutes a p-n junction diode in parallel to the Schottky diode 500. If a positive voltage is applied to the anode with respect to the cathode, which is larger than the turn-on voltage of the Schottky diode 500, but lower than the built-in voltage of this p-n junction diode, the forward current is to a large extent determined by the characteristics of the Schottky diode 500. However, the forward current is lower compared to the forward current of the Schottky diode 300 of FIG. 3, if the Schottky diode 500 is of the same size as the Schottky diode 300. If the applied positive voltage is larger than the built-in voltage of the above p-n junction diode, the paralleled p-n junction diode contributes to the forward current. The forward characteristics then deviates from the forward characteristics of a pure Schottky diode. For low biasing conditions, the Schottky diode 500 has an improved Ion/Ioff ratio, but the area consumption is increased and the switching performance may be reduced.

Figure 6:
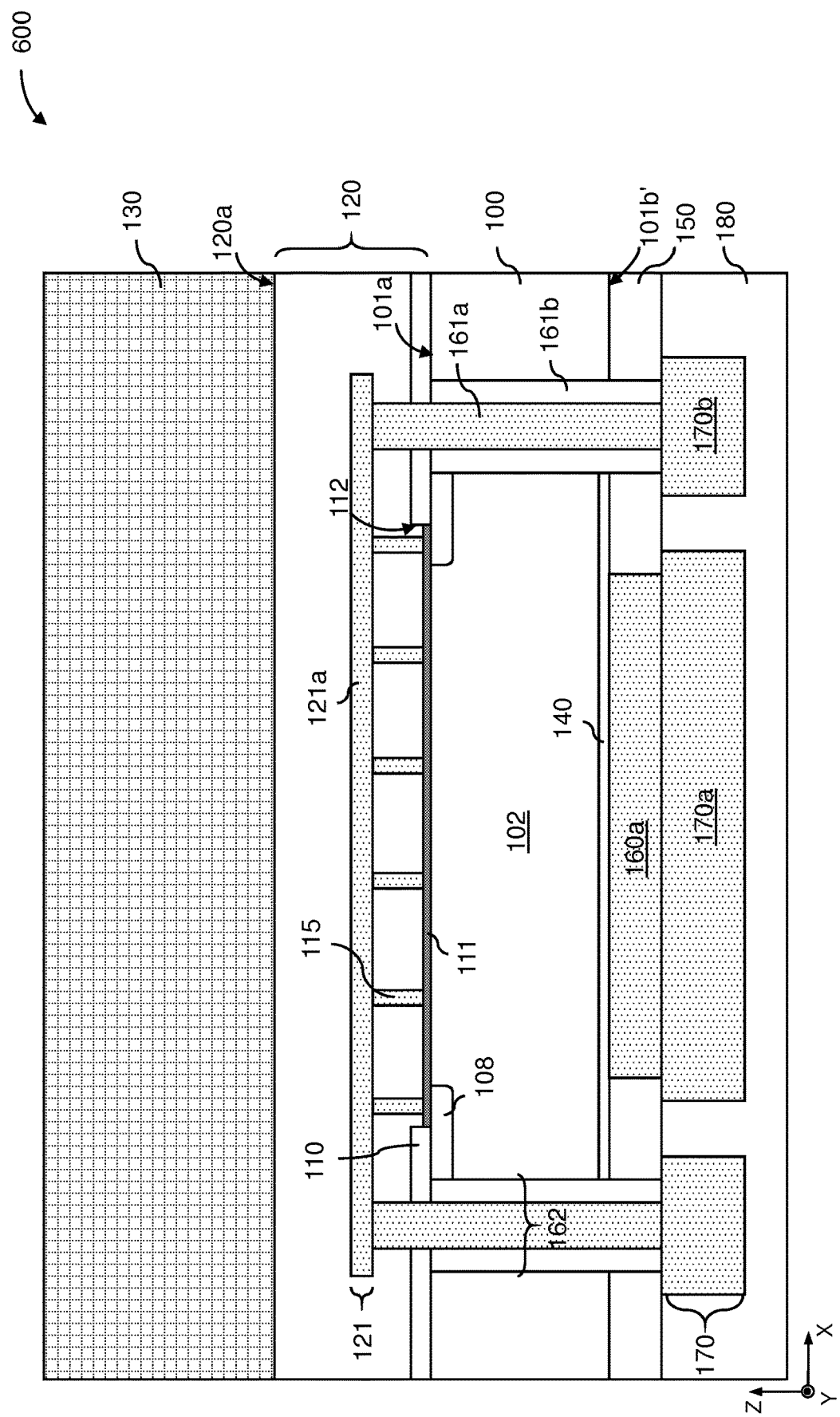

FIG. 6 shows still another alternative embodiment of the present solution.

The Schottky diode, here denoted with 600, differs from the Schottky diode 300 shown in FIG. 3 in that the anode and the cathode electrodes 111, 160*a* of the Schottky diode 600 are made available to the wirings (electrical connections) formed on the thinned backside surface 101*b*' of the substrate 101.

The through silicon via structure 162 is therefore used in this embodiment to bring the anode electrode 111 to the backside of the substrate 101. The first interconnection pad 121*a* achieves here an electrical connection between the contacts 115 formed on the cobalt silicide layer of the anode electrode 111 and the conductive filling 161*a* of the through silicon via structure 162. The first interconnection region 170*a* is again arranged above the backside surface 101*b*', in contact with the cathode electrode 160*a*; moreover, a second interconnection region 170*b* is formed in the same backside interconnection layer 170, in contact with the conductive filling 161*a* of the through silicon via structure 162.

It is noted that, to make the anode and the cathode of the Schottky diode 600 available to the wirings on the backside of the substrate 101, at least a second interconnection metal layer may be present on the backside (in a manner not shown, but that will be evident for a skilled person).

As the CMOS manufacturing process allows to form wirings on the frontside surface 101*a* of the substrate 101 as well as on the backside surface 101*b*' of the same substrate 101, it might indeed be useful in some instances to have both the anode and the cathode electrodes 111, 160*a* available to the wirings formed on the same backside surface 101*b*'. It might also be considered to have the anode electrode 111 of the Schottky diode available to the wirings on the frontside of the substrate 101 and the cathode electrode 160*a* available to the wirings formed on the backside of the same substrate 101. In this configuration (here not shown) the through silicon via structure 162 may have the only function to provide a lateral dielectric isolation for the Schottky diode; the same through silicon via structure 162 could in that case be electrically set at a reference voltage (ground) or left floating.

Figure 7:
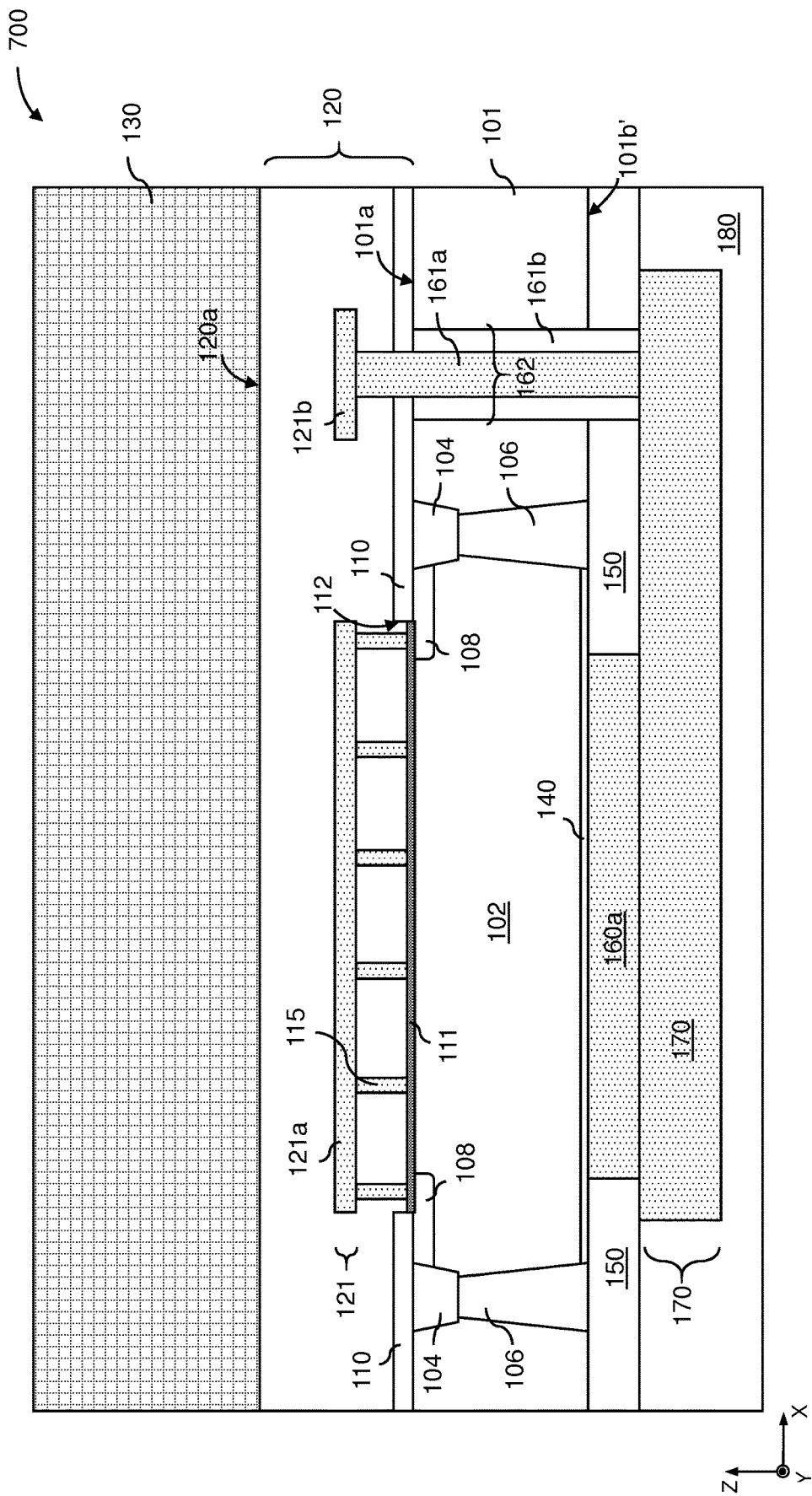

FIG. 7 shows a further alternative embodiment of the present solution.

The Schottky diode, here denoted with 700, differs from the Schottky diode 300 shown in FIG. 3 by being enclosed by a deep trench isolation 106.

The deep trench isolation 106 is formed by etching a trench extending from the backside surface 101b' towards the frontside surface 101a of substrate 101 and by filling the trench with a dielectric material, e.g. silicon oxide. The deep trench isolation 106 may extend (as shown in the same FIG. 7) from the backside surface 101b' of the substrate 101 to a shallow trench isolation 104 formed at the frontside surface 101a of the substrate 101. Shallow trench isolations are common in standard CMOS processes.

The lightly doped well 102 extends to the deep trench isolation 106 such that the entire substrate region enclosed by the deep trench isolation 106 has the doping of the lightly doped well. The guard ring 108 extends laterally from the anode electrode 111 to the shallow trench isolation 104. Moreover, the highly doped region 140 extends laterally to the deep trench isolation 106, such that the highly doped region 140 is arranged over the entire backside surface 101b' inside of the deep trench isolation enclosure.

In this case, the Schottky diode 700 is laterally isolated from other devices formed on the substrate 101 by the deep trench isolation enclosure, via dielectric isolation. In this alternative embodiment, the through silicon via structure 162 has the only function to make the cathode electrode 160a of the Schottky diode 700 available to the wirings disposed on frontside surface 101a of the substrate 101; the through silicon via structure 162 does not provide a lateral isolation for the Schottky diode 700 in this alternative embodiment.

The manufacturing process of the Schottky diode 300 of FIG. 3 is now discussed in more details (it is noted that the respective manufacturing process of the previously discussed alternative embodiments do not differ substantially from what will now be discussed, as will be evident for a skilled reader).

It is also noted that the manufacturing process is, in part, based on the process steps disclosed in the patent application EP 2 913 847 B1, in the name of the present Applicant (to which reference is made herein).

Figure 8A:
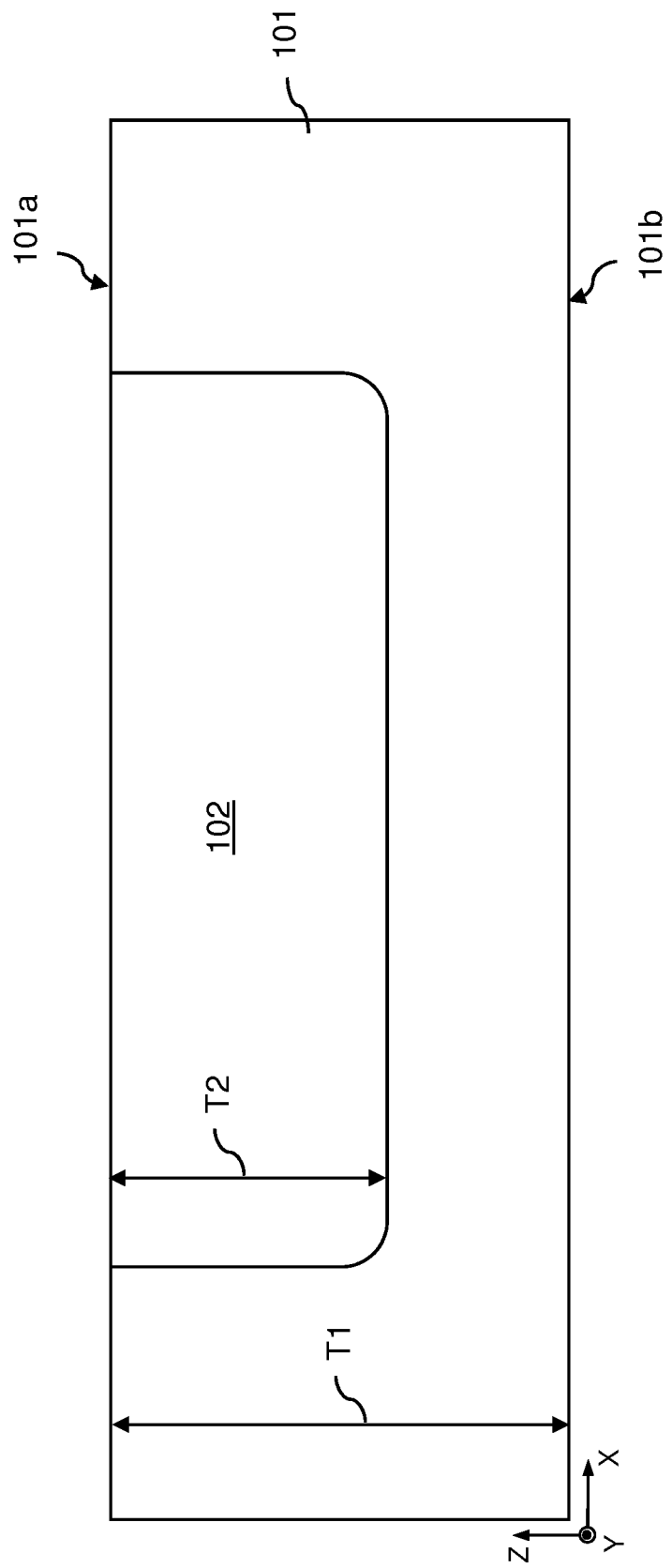
FIGS. 8A-8K are cross sections of the semiconductor vertical Schottky diode of FIG. 3 in subsequent steps of a corresponding manufacturing process.

As shown in FIG. 8A, a first step of the manufacturing process envisages providing a wafer of semiconductor material having the substrate 101, with the frontside surface 101a and backside surface 101b. The thickness T1 of the substrate 101 may be e.g. several hundreds of microns. The substrate 101 is made of semiconductor material, e.g. silicon, having a second conductivity type, e.g. p-type; the substrate 101 may also be an epitaxial layer, grown on a silicon wafer; for example, substrate 101 may be a lightly-doped silicon epitaxial layer having p-type conductivity, grown on a highly-doped silicon wafer.

The lightly doped well 102 is then formed in the surface portion of the substrate 101, facing the frontside surface 101a thereof. The lightly doped well 102 is formed by masked implantation and subsequent annealing, and has the first conductivity type (n-type). However, a p-type doping (doping of the second conductivity type) of the well 102 may also be envisaged; doping of the lightly doped well 102 and of the substrate 101 may be of the opposite conductivity type or of the same conductivity type. Doping concentration of the lightly doped well 102 at the frontside surface 101a is for example between $1e^{15}/cm^3$ to $1e^{17}/cm^3$; more preferably, the doping concentration at the frontside surface 101a is between $5e^{15}/cm^3$ to $5e^{16}/cm^3$. The depth of the lightly doped well 102 is denoted by T2 and is lower than the depth of the substrate 101 in the same vertical direction z.

In general, the Schottky contact could also be established on the same substrate 101, provided that the doping type and doping level is suitable. An n-type doping is preferred since a higher Richardson coefficient can be obtained. The light doping is generally required to obtain the desired Schottky characteristics.

Figure 8B:
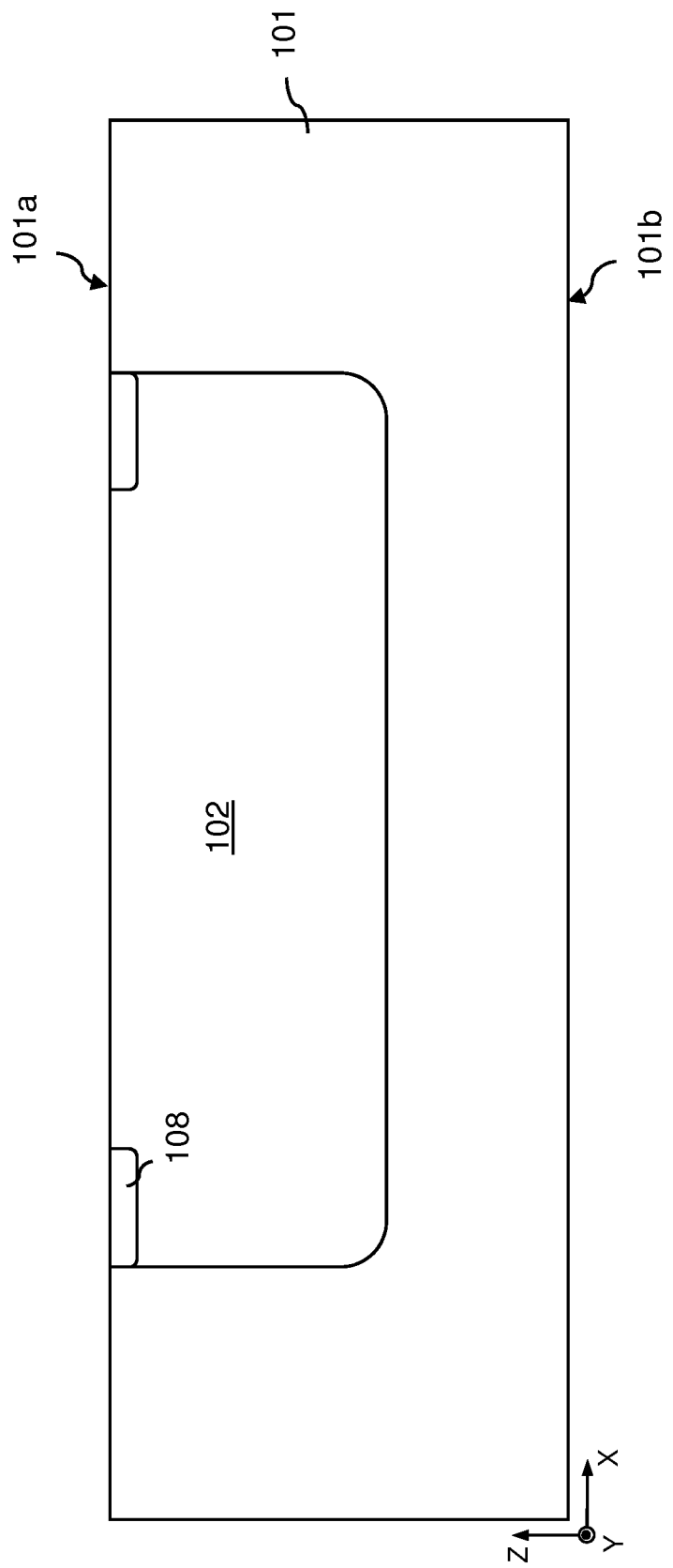
Figure 8C:
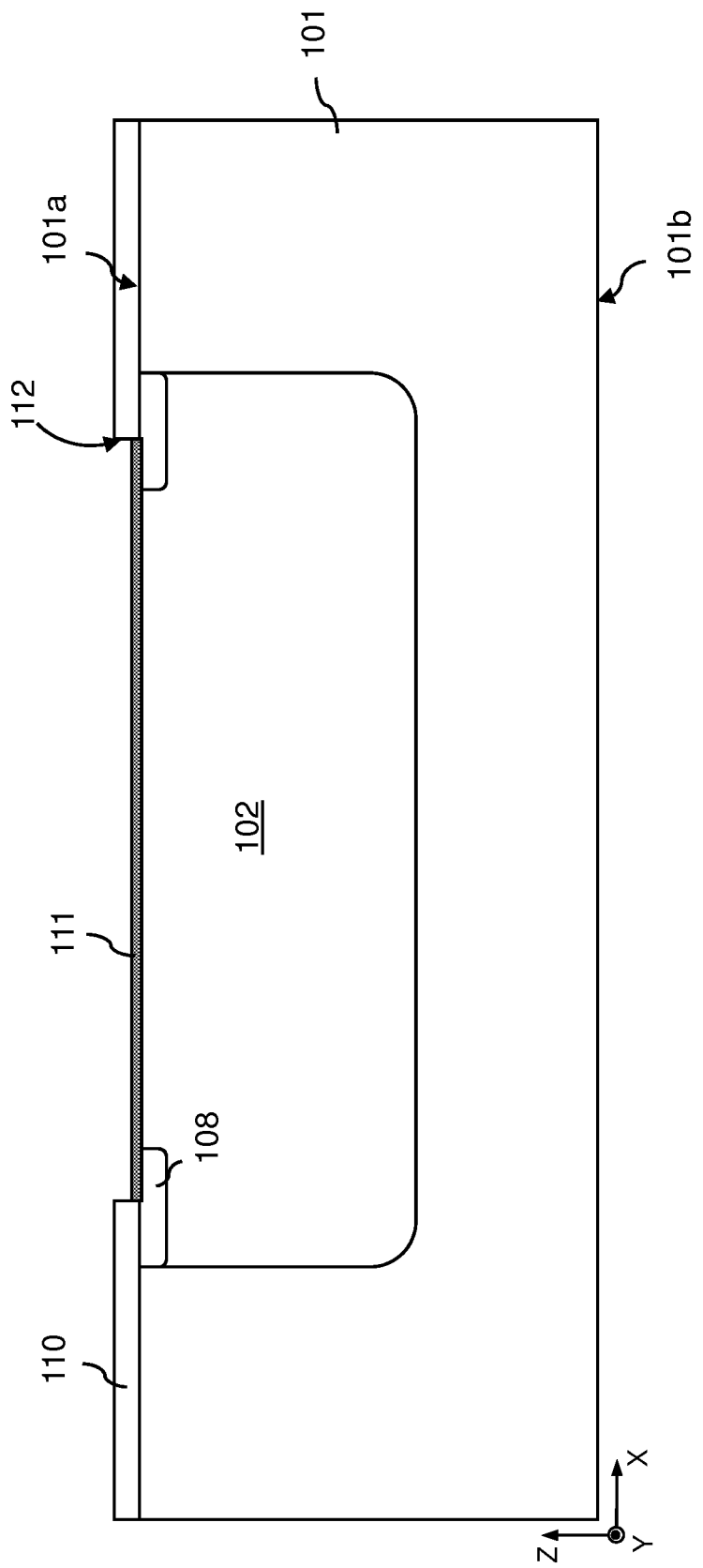

Subsequently, as shown in FIG. 8B, the guard ring 108 is formed in the lightly doped well 102, at the frontside surface 101a. The guard ring 108 might be aligned to the peripheral edge of the lightly doped well 102 as shown in FIG. 8B. The guard ring 108 has the opposite conductivity type as the lightly doped well 102. In the preferred embodiment, in which the lightly doped well 102 has the first conductivity type, the guard ring 108 has the second conductivity type. The depth of the guard ring 108 is far smaller than the depth of the lightly doped well 102. The guard ring 108 could be formed together with source/drain implantations available in a standard CMOS process. Afterwards, as shown in FIG. 8C, the silicide blocking layer 110 is deposited on the frontside surface 101a of the substrate 101. The silicide blocking layer 110 may be made of silicon oxide or a stack consisting of a silicon oxide layer and a silicon nitride layer disposed on the silicon oxide layer. The opening 112 is then formed through the silicide blocking layer 110 in the region where the Schottky contact will be formed. A cobalt silicide layer is formed in the opening 112 through the silicide blocking layer 110, to form the anode electrode 111 of the Schottky diode 300. The process of silicide formation is well known in the art and is therefore not described herein; in particular, a cobalt silicidation process sequence is available in many CMOS processes.

A Schottky diode could be formed also with other metals or metal silicides disposed on the lightly doped well 102, provided that the Schottky barrier height of the metal or metal silicide on the n-type or p-type well is suitable.

Figure 8D:
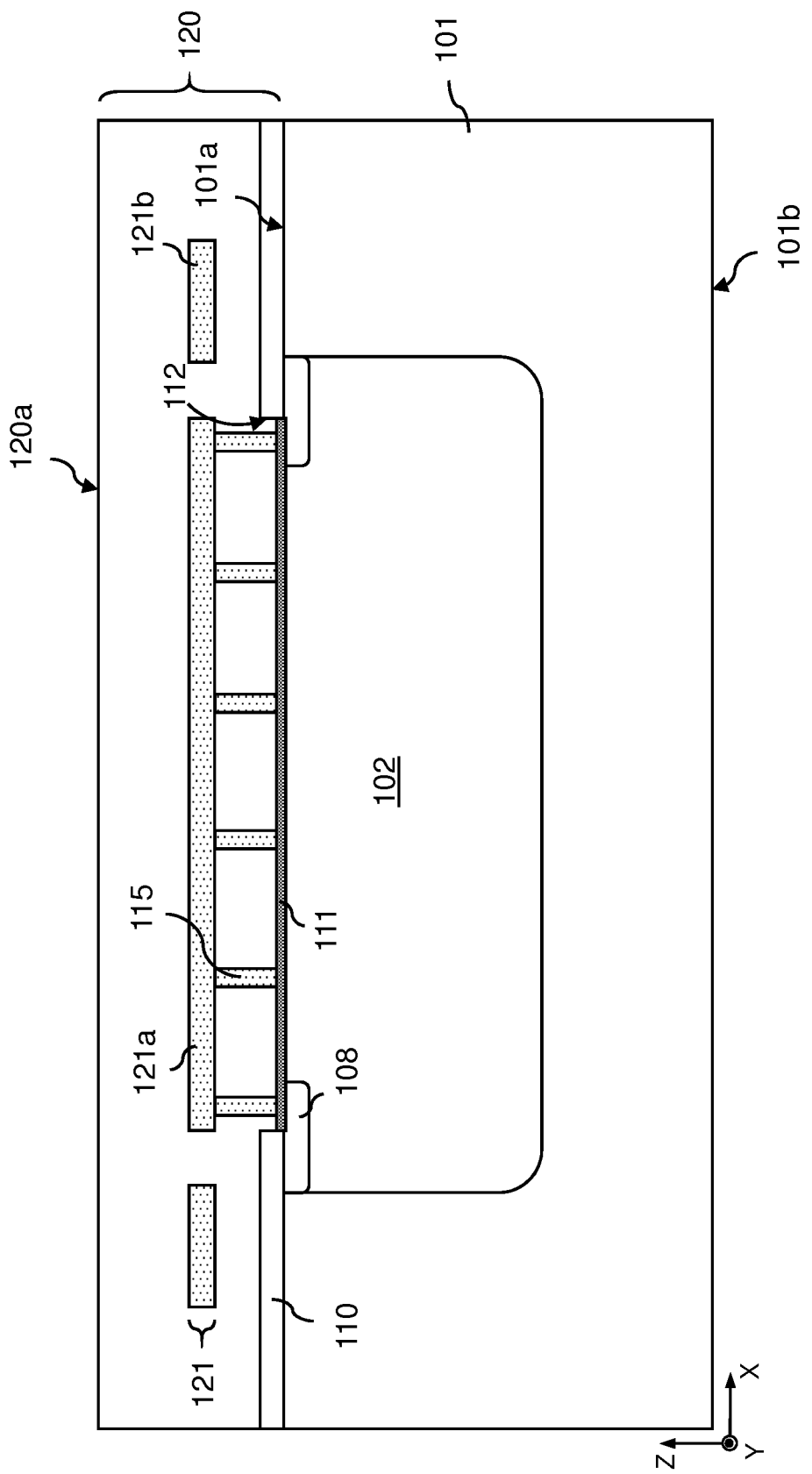

In the embodiment shown, the anode electrode 111 has an overlap on the guard ring 108, as shown in the same FIG. 8C. Turning now to FIG. 8D, further processing steps are performed on the frontside surface 101a of the substrate 101, for the formation of the CMOS layer stack (including a suitable number of dielectric and interconnected conductive layers).

In particular, contacts 115 are formed in the intermetal dielectric layer 120, extending from the cobalt silicide layer of the anode electrode 111 and the first interconnection pad 121a formed in the first interconnection metal layer 121.

The second interconnection pad 121b is also formed in the same first interconnection metal layer 121, as a landing pad for the subsequently formed through silicon via structure 162 (as will be discussed in the following). Since, in the discussed embodiment, the through silicon via structure 162 encloses the Schottky diode 300, also the second interconnection pad 121b encloses laterally surrounds the first interconnection pad 121a, for example forming a ring around the same first interconnection pad 121a. The width of the second interconnection pad 121b is larger than the width of the subsequently formed through silicon via structure 162. Several interconnection metal layers and vias might be formed in the intermetal dielectric 120, as in standard CMOS processes.

In contrast to standard CMOS processes, no bonding pads are instead formed with the last interconnection metal layer, on the top surface 120a of the intermetal dielectric layer 120, after finishing of the frontside process steps. The top surface 120a is made of silicon oxide, and is essentially planar, which is achieved by chemical-mechanical polishing.

Figure 8E:
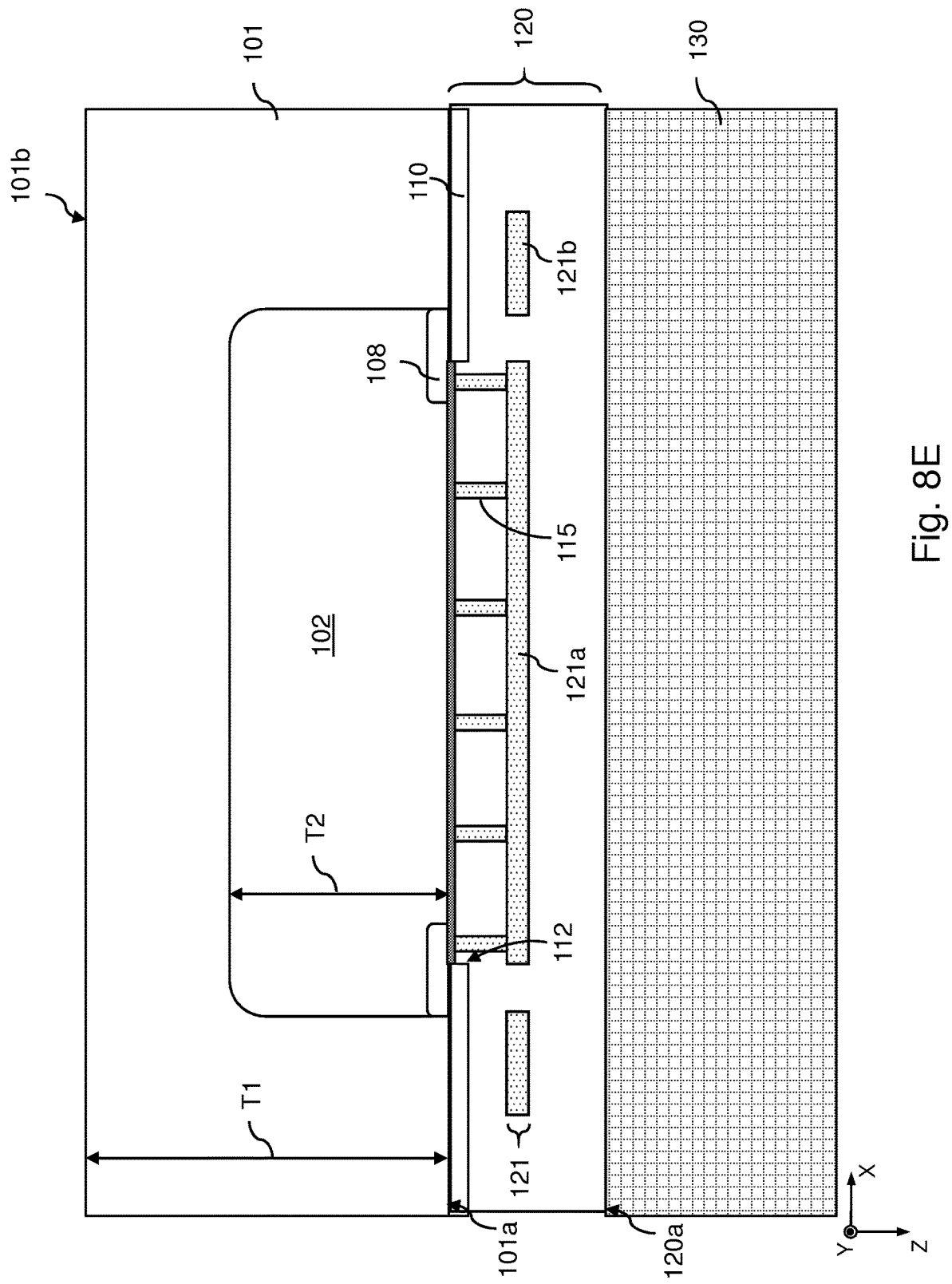

As shown in FIG. 8E, the substrate 101 is then flipped (i.e. with the backside surface 101b facing up and the frontside surfaces 101a facing down), and the top surface 120a of the intermetal dielectric layer 120 is bonded onto a carrier wafer 130.

The carrier wafer 130 may be a semiconductor wafer or a wafer of different material that is compatible with CMOS manufacturing requirements. A permanent bond is achieved between the top surface 120a and the carrier wafer 130 (a possible method to achieve a permanent bond is described e.g. in EP 2 913 847 B1; however, any known method to achieve such a bonding may as well be used).

Figure 8F:
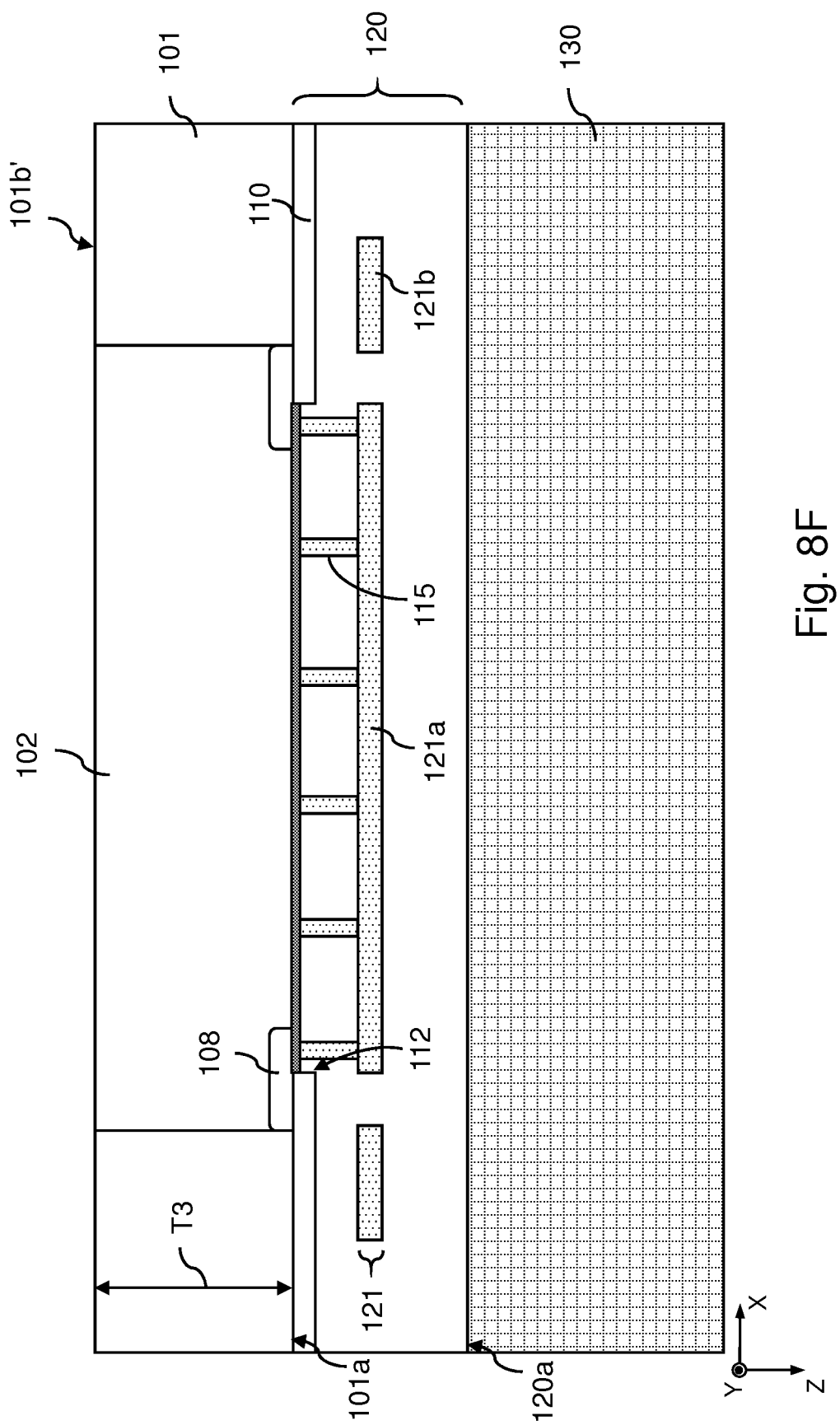

As shown in FIG. 8F, the substrate 101 is then thinned from the backside surface 101b, by removing material from the backside. By the thinning step, the thickness of the substrate 101 is reduced from thickness T1 to a thickness T3. The thinning process can be performed by a combination of back-grinding, etching and chemical-mechanical polishing (again, a possible method for the thinning operation is described in EP 2 913 847 B1). A low and uniform thickness T3 can be achieved. The resulting thinned backside surface 101b' (that defines the actual backside surface of the resulting thinned substrate 101) is essentially planar. The thickness T3 is e.g. between 1.5 µm and 15 µm. The thickness T3 is required to be lower than the thickness T2 of the lightly doped well 102. In this way, the lightly doped well 102 becomes exposed at the thinned backside surface 101b' (if the Schottky diode 300 is formed in an epitaxial layer with suitable doping, this requirement does not apply).

Figure 8G:
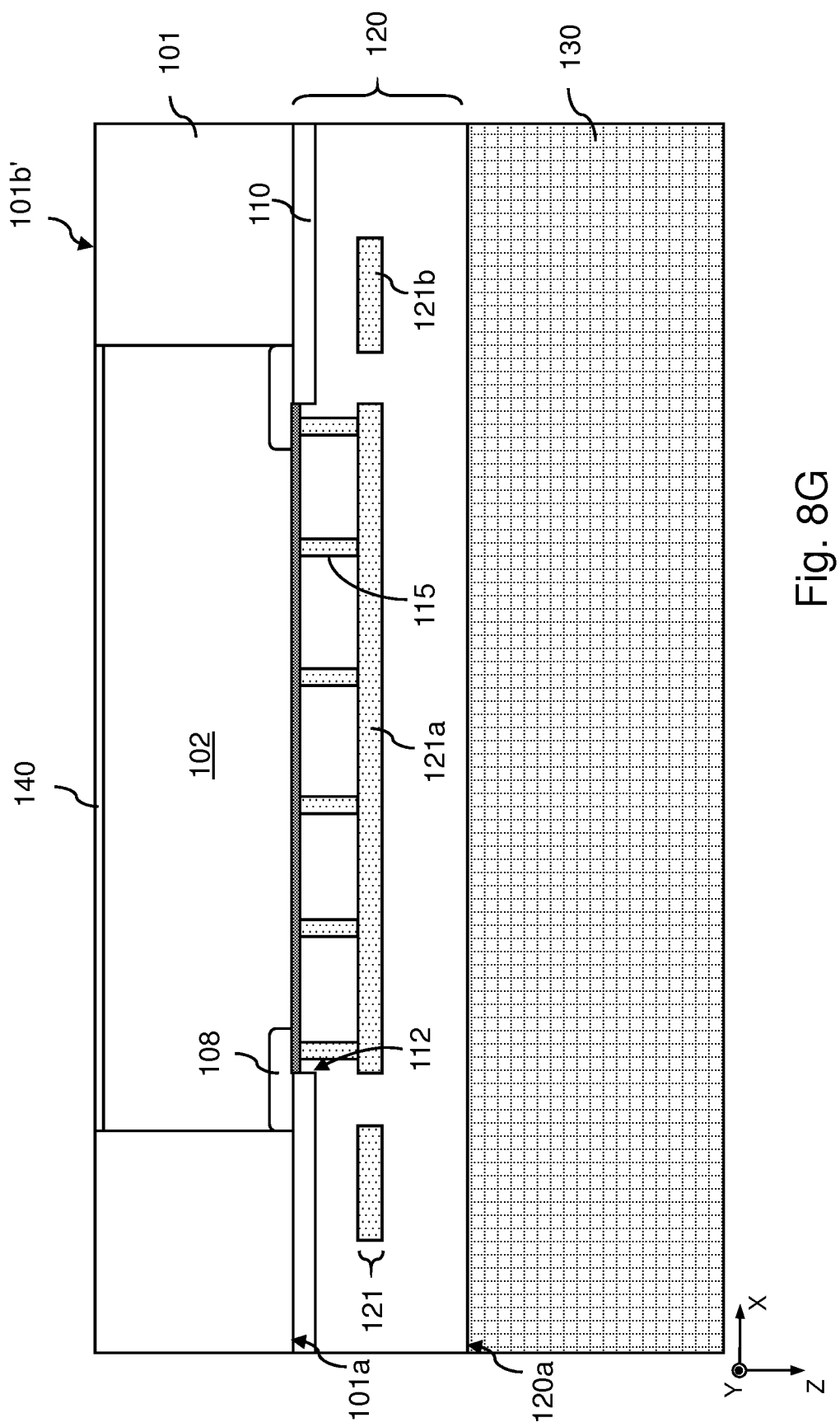

Turning now to FIG. 8G, the shallow and highly doped region 140 is formed in the lightly doped well 102, at the thinned backside surface 101b'. The shallow and highly doped region 140 is formed e.g. by a resist-masked implantation followed by laser thermal annealing (processing details may again be found in EP 2 913 847 B1).

The highly doped region 140 may be aligned to the lightly doped well 102 as shown in the same FIG. 8G. The doping level of the highly doped region 140 at the thinned backside surface 101b' is such that an Ohmic contact to the lightly doped well 102 can be achieved with a metal deposition.

Figure 8H:
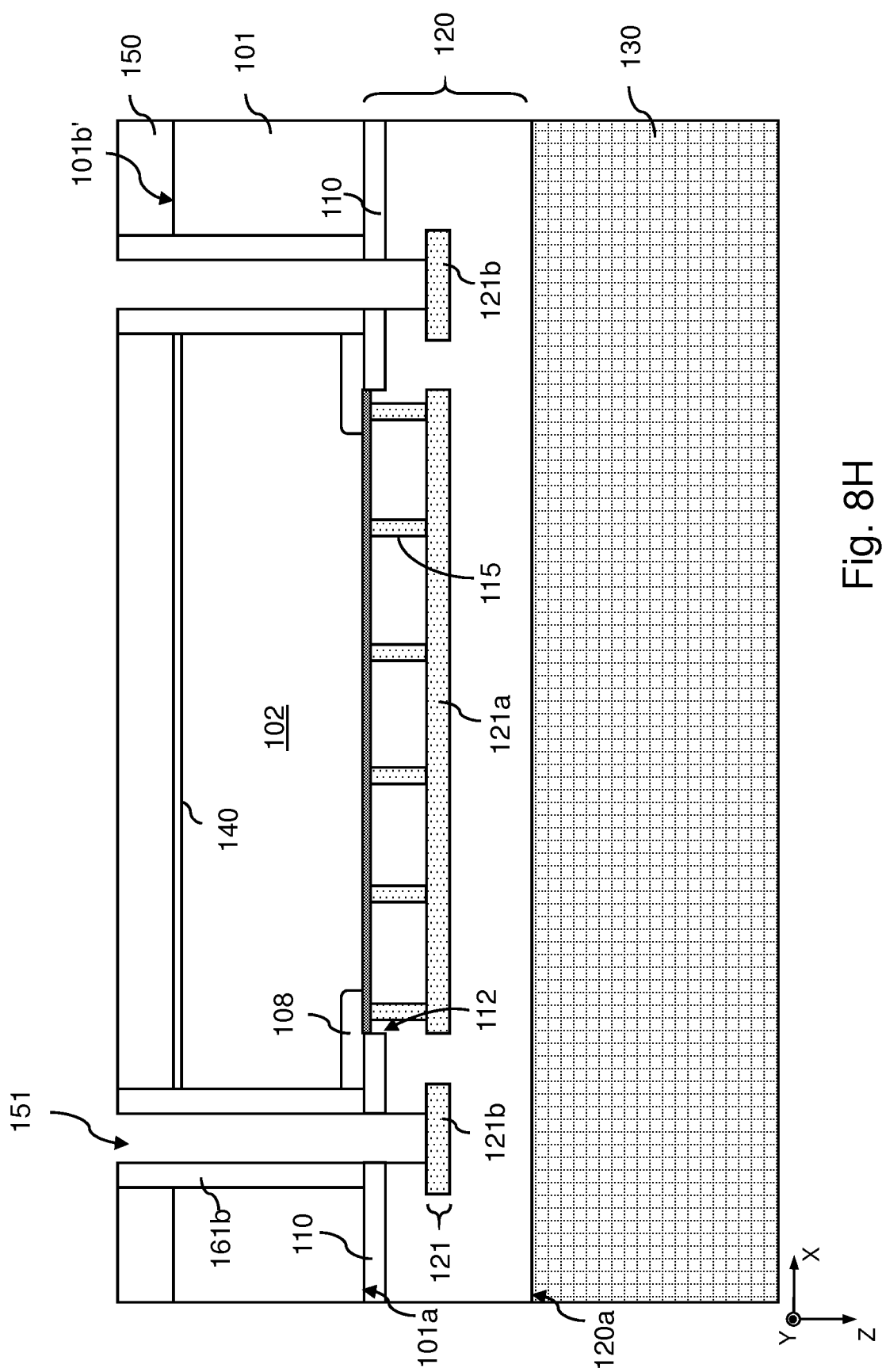

Afterwards, as shown in FIG. 8H, the dielectric layer 150, made of silicon oxide or other dielectric material, is deposited on the thinned backside surface 101b' of the substrate 101. Then, a through silicon via (TSV) opening 151 is etched from the top of the dielectric layer 150 on the thinned backside surface 101b', extending to the silicide blocking layer 110. Dielectric liner 161b is then deposited into the etched TSV opening 151, and afterwards etching is continued such that the second interconnection pad 121b becomes exposed, at the bottom of the same TSV opening 151.

Figure 8I:
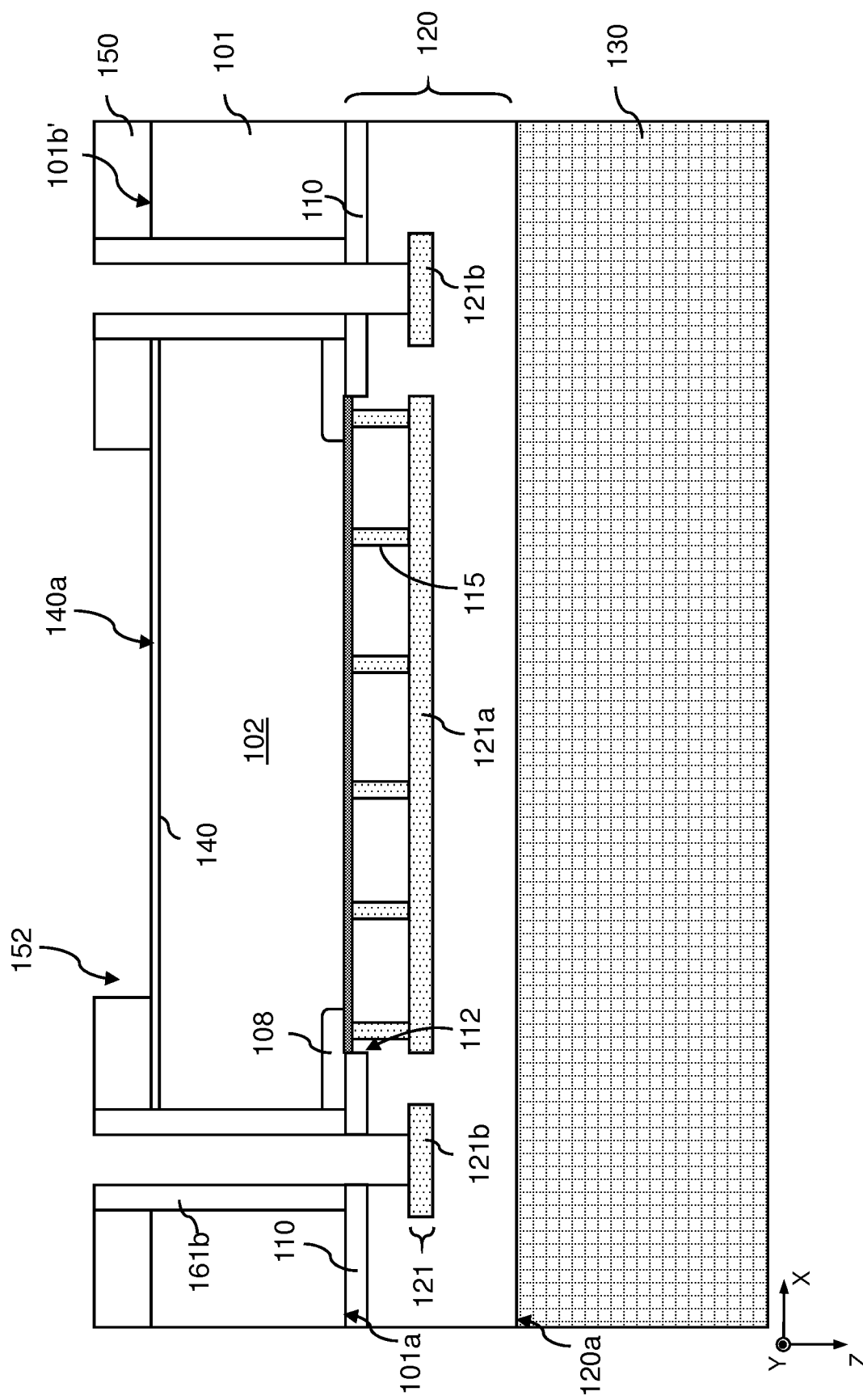

As shown in FIG. 8I, the backside contact opening 152 is etched into dielectric layer 150, such that the highly doped region 140 becomes exposed. The backside contact opening 152 lies completely within the highly doped region 140. Over-etching is required to be very small so that at the resulting surface 140a the doping concentration is sufficiently high to allow the formation of an Ohmic metal contact at the same surface 140a.

Figure 8J:
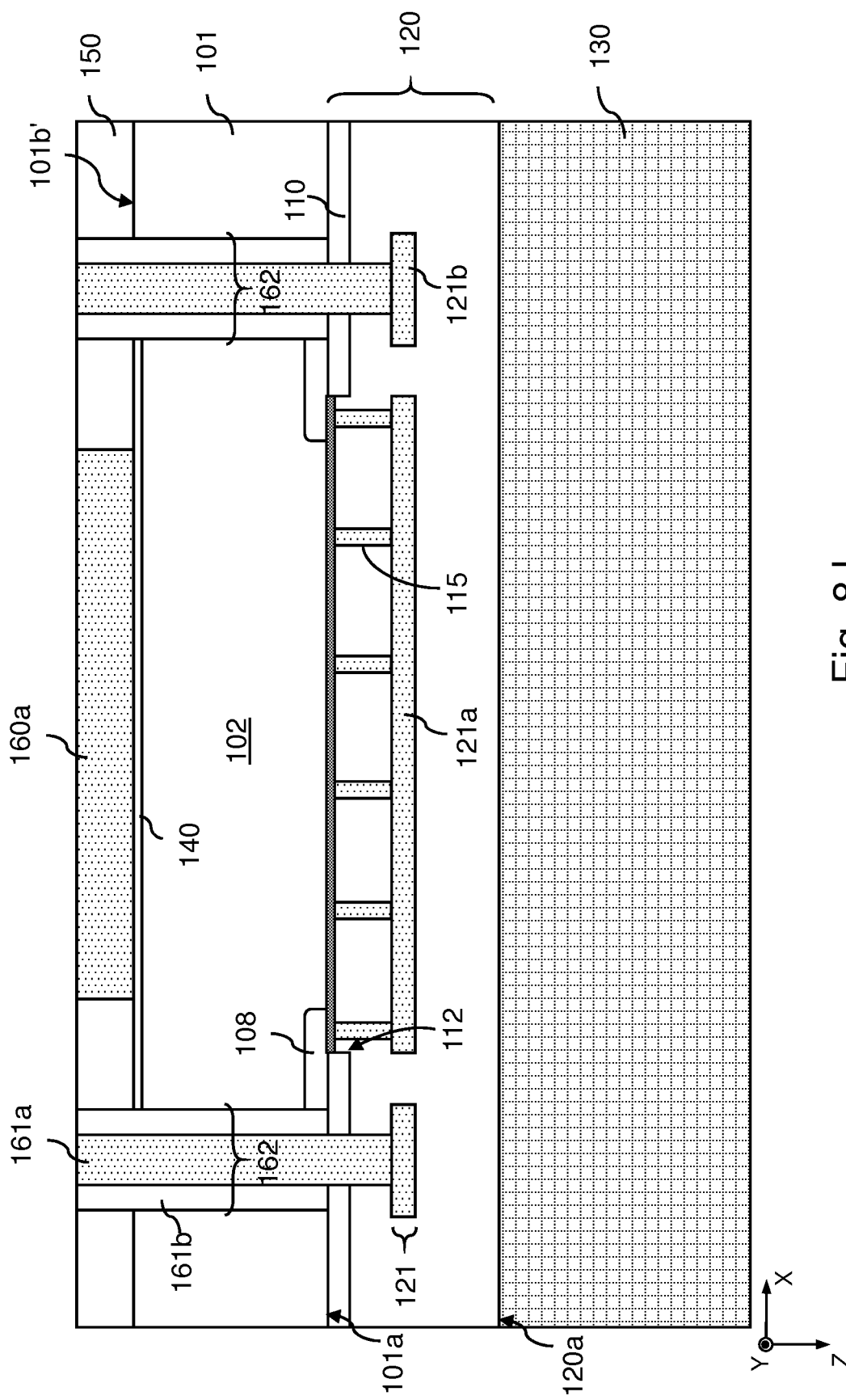

Turning now to FIG. 8J, the through silicon via opening 151, as well as the backside contact opening 152, are filled with conductive material, e.g. aluminum, tungsten or copper (the conductive materials can include adhesion and barrier layers, in a per-se known manner), to form both the conductive filling 161a of the through silicon via structure 162 (which is thereby formed) and, concurrently, the cathode electrode 160a of the Schottky diode 300. Preferably, metal formation is followed by chemical-mechanical polishing. As already discussed, by depositing a metal into the backside contact opening 152, an Ohmic metal contact is formed on the lightly doped well 102, from the backside.

Figure 8K:
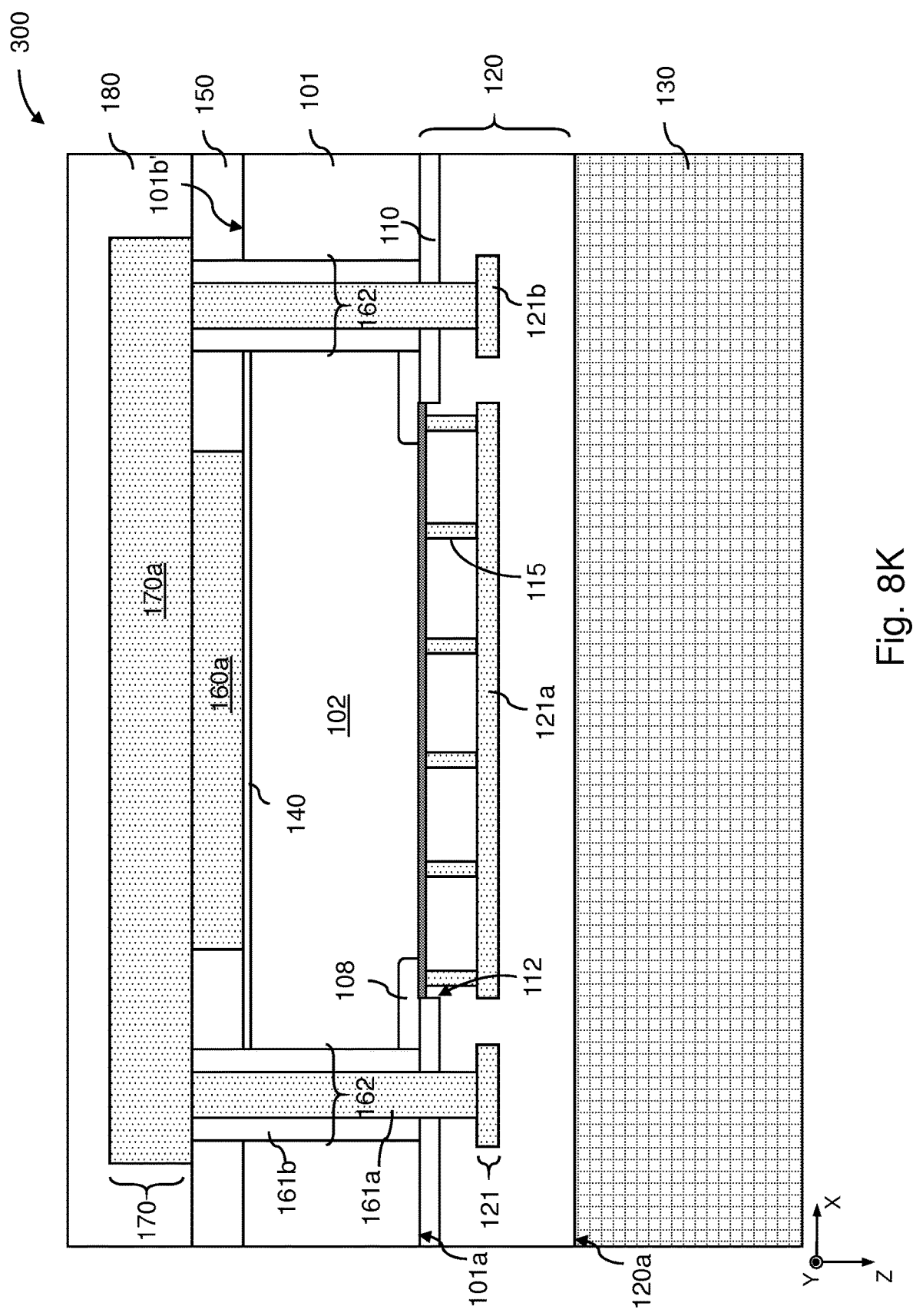

As shown in FIG. 8K, the first interconnection layer 170, e.g. made of aluminum or copper, is formed on the backside surface 101b', in particular on the dielectric layer 150. The first interconnection layer 170 is then patterned to form the first interconnection region 170a, which establishes an electrical connection between the through silicon via structure 162 and the cathode electrode 160a. More interconnection metal layers and vias could be added on the same backside surface 101b' to form suitable connection patterns on the same backside surface 101b'. The first interconnection layer 170 are disposed in an intermetal dielectric 180. The intermetal dielectric 180 may be silicon oxide or a spin-on dielectric like polyimide, benzocyclobutene, or the like.

Bonding or bumping pads (here not shown) are subsequently formed with the last backside metal interconnection layer, suitably connected to the anode and/or cathode electrodes 111, 160a of the Schottky diode 300 (and/or to the further integrated circuit formed in the substrate 101), to make the electric signals available to the outside (the formation of these pads 190 is per-se known, and is not discussed in detail herein).

The advantages that the proposed solution allows to achieve are clear from the foregoing disclosure.

In particular, by forming anode and cathode electrodes 111, 160a of the Schottky diode on opposite sides of a same thinned substrate 101, a high area efficiency can be achieved. The added series resistance due to the backside metal wiring and the required through silicon via is low compared to the parasitic series resistance introduced, e.g., by a buried layer and a sinker. In the proposed Schottky diode there is no fundamental limit for the size of the same anode and cathode electrodes 111, 160a. The area consumption of the through silicon via structure 162 is typically lower than the area consumption of a sinker structure.

Besides the advantage of having a lower area consumption and a reduced series resistance, the proposed high voltage Schottky diode has the following additional advantages:
  no parasitic bipolar transistor (the electrical characteristics of the Schottky diode cannot be impaired by the action of a parasitic bipolar transistor);
  very low substrate current (due to a full dielectric isolation);
  reduced edge leakage in reverse bias (due to the fact the equipotential distribution in reverse bias is nearly planar; this helps to reduce the electric field at the edge of the Schottky area).

Moreover, minority carrier injection and parasitic capacitance can be minimized by a proper layout of the proposed Schottky diode. The guard ring 108 introduces a parasitic capacitance into the device and can give rise to minority carrier injection. Minority carrier injection increases the reverse recovery time of the diode in switching applications. The layout of the proposed Schottky diode can be chosen to have a high area-to-perimeter ratio. For instance, the layout can be chosen to be circular or quadratic or nearly quadratic. In this way the total guard ring area for a given Schottky area can be minimized. The proposed Schottky diode has thus a reduced switching loss.

The manufacturing process envisages standard steps of CMOS processing, thus having reduced complexity and costs. The higher area efficiency and reduced series resistance of the proposed integrated Schottky diode translates into a further cost advantage.

Finally, it is clear that modifications and variations may be made to what has been described and illustrated herein, without thereby departing from the scope of the present invention, as defined in the annexed claims.

The invention claimed is:

1. A semiconductor device comprising an integrated vertical Schottky diode, said device comprising:
- a substrate of semiconductor material, having a front surface and a back surface and an integrated circuit formed therein;
- a lightly doped region formed in a surface portion of the substrate facing the front surface, having a first conductivity type;
- a first electrode formed on the lightly doped region on the front surface of the substrate, to establish a Schottky contact;
- a highly doped region at the back surface of the substrate, in contact with the lightly doped region and having the first conductivity type;
- a second electrode electrically in contact with the highly doped region, on the back surface of the substrate, to establish an Ohmic contact;
- further comprising an intermetal dielectric layer on the front surface of the substrate and at least a first frontside interconnection metal layer arranged in the intermetal dielectric layer above said front surface;
- a first interconnection pad defined in said first frontside interconnection metal layer and providing a first electrical contact available at the front surface, electrically contacting said first electrode via contacts extending through said intermetal dielectric layer;
- a second interconnection pad defined in said first frontside interconnection metal layer to provide a second electrical contact available at said front surface;
- a further intermetal dielectric layer above the back surface of the substrate and at least a first backside interconnection metal layer defining at least a first interconnection region arranged in the further intermetal dielectric layer;
- further comprising a through silicon via structure, including a dielectric liner and a conductive filling, and laterally enclosing said lightly doped region and said highly doped region, providing an electrical isolation, wherein said through silicon via structure:
- extends from said second interconnection pad to said at least first interconnection region which is in electrical contact with the second electrode, the conductive filling of the through silicon via structure establishing an electrical contact between the second electrode and the second interconnection pad,
- or extends from the first interconnection pad to a second interconnection region, the conductive filling of the through silicon via structure establishing an electrical contact between the first electrode and the second interconnection region, which thereby provides a first electrical contact available at said back surface.

2. The device according to claim 1, further comprising a carrier wafer bonded to a top surface of said intermetal dielectric layer.

3. The device according to claim 1, wherein said first electrode is formed of a metal silicide layer.

4. The device according to claim 1, further comprising a guard ring, constituted by a doped region of a second conductivity type, opposite to the first conductivity type, arranged in a perimeter region of the lightly doped region at the front surface of the substrate.

5. The device according to claim 4, wherein the guard ring: overlaps and is in contact with the first electrode; or does not contact the first electrode and is floating.

6. The device according to claim 1, further comprising a grid of doped regions of a second conductivity type, opposite to the first conductivity type, arranged in the lightly doped region at the front surface of the substrate, having identical width and being equidistant.

7. The device according to claim 1, further comprising a deep-trench isolation region of a dielectric material, extending from the back surface of the substrate to a shallow-trench isolation formed in the lightly doped region at the frontside surface of the substrate; said shallow-trench isolation and deep-trench isolation region jointly laterally enclosing said lightly doped region and said highly doped region providing a dielectric isolation.

8. The device according to claim 2, wherein said first electrode is formed of a metal silicide layer.

* * * * *